(12) United States Patent
Tamiya

(10) Patent No.: US 11,062,066 B2
(45) Date of Patent: Jul. 13, 2021

(54) INFORMATION PROCESSING APPARATUS, COMPUTER-READABLE RECORDING MEDIUM, AND INFORMATION PROCESSING METHOD

(71) Applicant: FUJITSU LIMITED, Kawasaki (JP)

(72) Inventor: Yutaka Tamiya, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/353,322

(22) Filed: Mar. 14, 2019

(65) Prior Publication Data
US 2019/0205487 A1  Jul. 4, 2019

Related U.S. Application Data

(63) Continuation of application No. PCT/JP2017/046498, filed on Dec. 25, 2017.

(30) Foreign Application Priority Data

Jan. 11, 2017 (JP) .............................. JP2017-002530

(51) Int. Cl.
*G06F 30/327* (2020.01)
*G06F 30/33* (2020.01)
(Continued)

(52) U.S. Cl.
CPC ............ *G06F 30/327* (2020.01); *G06F 30/33* (2020.01); *G06F 30/39* (2020.01); *G06F 30/392* (2020.01)

(58) Field of Classification Search
CPC ...... G06F 30/327; G06F 30/392; G06F 30/39; G06F 30/33
See application file for complete search history.

(56) References Cited

U.S. PATENT DOCUMENTS 5,926,632 A * 7/1999 Kawaguchi ........... G06F 30/392
716/105
6,437,804 B1 * 8/2002 Ibe ........................ G06F 30/18
715/736
(Continued)

FOREIGN PATENT DOCUMENTS

JP   2000-222442   8/2000
JP   2001-142922   5/2001
(Continued)

OTHER PUBLICATIONS

International Search Report dated Feb. 6, 2018 in corresponding International Application No. PCT/JP2017/046498.
(Continued)

*Primary Examiner* — Nha T Nguyen
(74) *Attorney, Agent, or Firm* — Staas & Halsey LLP

(57) ABSTRACT

An information processing apparatus includes a memory; and a processor coupled to the memory and the processor that creates module partitioning candidates of a plurality of software codes including one or more input nodes from a plurality of input nodes in a data flow graph and calculates a cost corresponding to a bit width of a signal line of the module partitioning candidates for each of the created plurality of module partitioning candidates, and selects one or more module partitioning candidates having a given cost from the plurality of module partitioning candidates as a partitioning target module based on the calculated cost.

15 Claims, 17 Drawing Sheets

(51) Int. Cl.
*G06F 30/39* (2020.01)
*G06F 30/392* (2020.01)

(56) References Cited

U.S. PATENT DOCUMENTS

| | | | |
|---|---|---|---|
| 6,493,863 B1 | 12/2002 | Hamada et al. | |
| 8,176,452 B2 * | 5/2012 | Pandey | G06F 30/392 |
| | | | 716/105 |
| 8,255,860 B1 * | 8/2012 | Fung | G06F 30/327 |
| | | | 716/134 |
| 8,701,069 B1 * | 4/2014 | Dimond | G06F 30/34 |
| | | | 716/117 |
| 9,858,373 B2 * | 1/2018 | Cho | G06F 30/327 |
| 2004/0088666 A1 * | 5/2004 | Poznanovic | G06F 30/30 |
| | | | 716/105 |
| 2004/0088685 A1 * | 5/2004 | Poznanovic | G06F 8/447 |
| | | | 717/140 |
| 2005/0289499 A1 * | 12/2005 | Ogawa | G06F 30/30 |
| | | | 716/104 |
| 2009/0178013 A1 * | 7/2009 | Wang | G06F 30/394 |
| | | | 716/132 |
| 2012/0131530 A1 * | 5/2012 | Moffitt | G06F 30/331 |
| | | | 716/113 |
| 2016/0004797 A1 | 1/2016 | Hirano et al. | |
| 2017/0017747 A1 * | 1/2017 | Cho | G06F 30/30 |

FOREIGN PATENT DOCUMENTS

| | | |
|---|---|---|
| JP | 2010-113405 | 5/2010 |
| JP | 2012-150631 | 8/2012 |
| JP | 2016-14950 | 1/2016 |

OTHER PUBLICATIONS

Written Opinion of the International Searching Authority dated Feb. 6, 2018 in corresponding International Application No. PCT/JP2017/046498.

Japanese Office Action dated Jul. 28, 2020 from Japanese Patent Application No. 2017-002530, 9 pages.

* cited by examiner

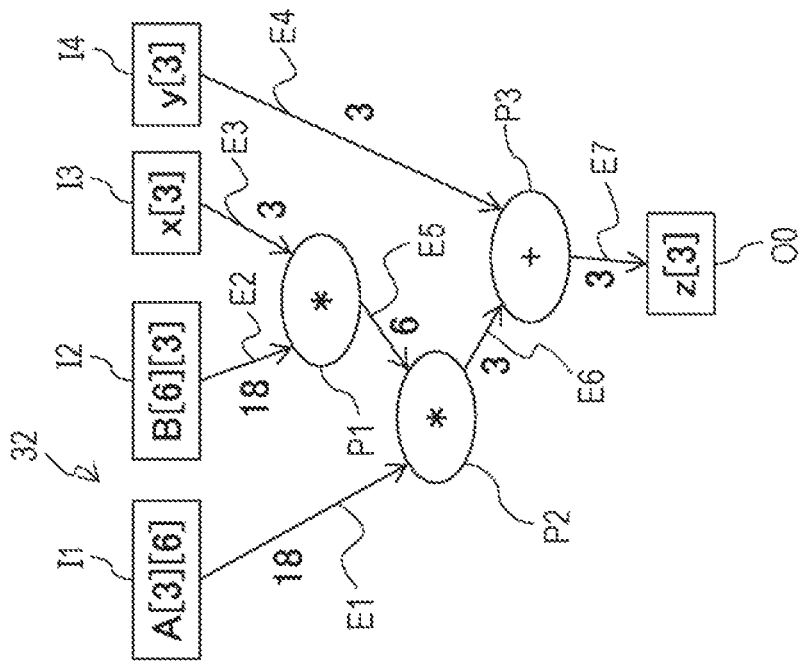

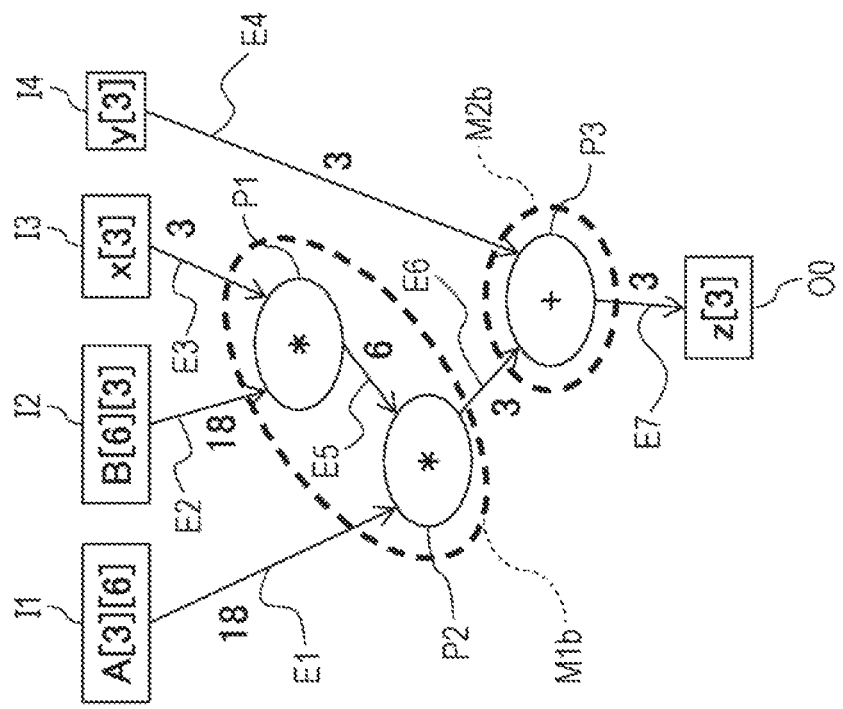
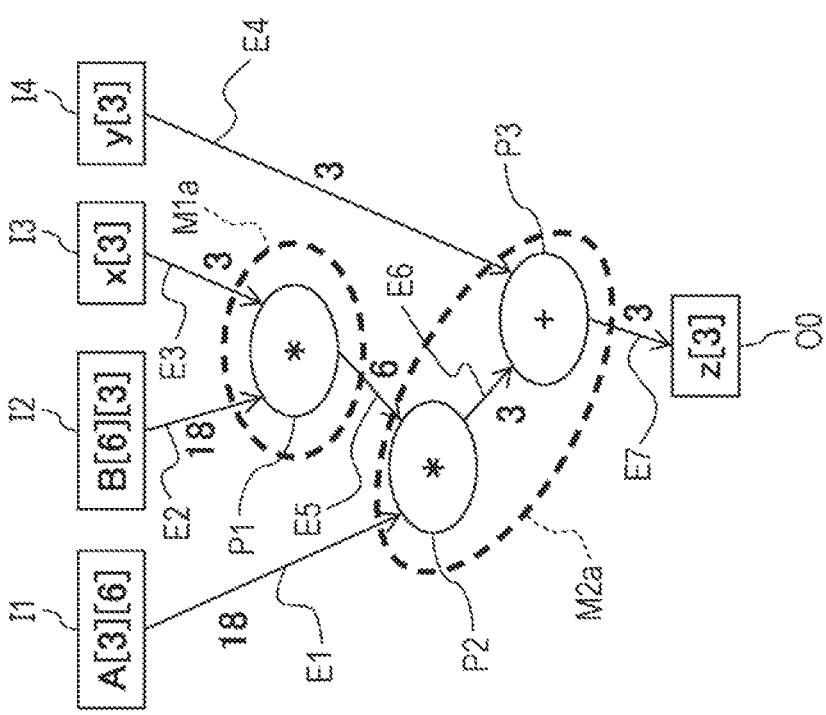

{
C1 CANDIDATE:= ({C}, 48, {B,C})
C2 CANDIDATE:= ({B,C}, 51, {A,C})
C3 CANDIDATE:= ({A,B,C}, 45, {C})
}

M LIST OF C = {
({C}, 48, {B, C}),
({B,C}, 51, {A, C}),
({A,B,C}, 45, {C})
}

34

- A: ({A}, 12, {A})  ...[A1]
- B: ({B}, 20, {A,B}),  ...[B1]
  ({A,B}, 20, {A, B})  ...[B2]
- C: ({C}, 20, {A,C}),  ...[C1]
  ({A,C}, 20, {A,C})  ...[C2]

INFORMATION PROCESSING APPARATUS, COMPUTER-READABLE RECORDING MEDIUM, AND INFORMATION PROCESSING METHOD

CROSS-REFERENCE TO RELATED APPLICATION

This application is a continuation application of International Application PCT/JP2017/046498 filed on Dec. 25, 2017 and designated the U.S., the entire contents of which are incorporated herein by reference. The International Application PCT/JP2017/046498 is based upon and claims the benefit of priority of the prior Japanese Patent Application No. 2017-002530, filed on Jan. 11, 2017, the entire contents of which are incorporated herein by reference.

FIELD

The embodiment discussed herein is related to an information processing apparatus, a computer-readable recording medium, and an information processing method.

BACKGROUND

In recent years, with an expansion of IT business, there is an increasing demand for acceleration technology for executing software executed by a processor such as CPU(s) by dedicated hardware such as LSI and FPGA. Tools for performing high level synthesis (HLS) for converting software code to hardware are put into practical use as acceleration technology. IT is an abbreviation for Information Technology, CPU is an abbreviation for Central Processing Unit, and LSI is an abbreviation for Large Scale Integration circuit. FPGA is an abbreviation for Flexible Programmable Gate Array, and HLS is an abbreviation for High-Level Synthesis.

Usually, there is a limit to a circuit scale that may be handled by a high-level synthesis tool. Therefore, when acceleration is performed, module partitioning is performed, in which given software code is partitioned into modules of an appropriate size. Experience has illustrated that a quality of module partitioning is greatly related to man-hours for layout synthesis and an achievement performance of a finally obtained hardware circuit. Here, the layout synthesis is a step of synthesizing a high-level synthesis result (logic circuit data) obtained for each of a plurality of partitioned modules into hardware circuit data.

Commonly, the above-described module partitioning is performed manually by an expert who has knowledge and experience of both software design and hardware design. For this reason, the quality of the module partitioning depends on the skill of a user. Therefore, development of a tool capable of automatically performing optimum module partitioning considering layout synthesis without depending on the skill of the user is desired.

At present, for example, a technique has been proposed, in which a graph illustrating a connection relationship between nodes of register transfer level (RTL) is generated, the generated graph is partitioned according to a partitioning rule prepared in advance, and a partial circuit of an optimal scale is reconfigured (see Japanese Laid-open Patent Publication No. 2000-222442). In addition, for example, in order to perform module partitioning so as to reduce power consumption based on a data flow graph, the operation of dividing the data flow graph into two at the center point on the data path is repeated, and in a case where there are a plurality of partitioning candidates at the time of division, a technique for selecting partitioning candidates having the smallest number of edges (the number of cuts) traversing a partitioning boundary has been proposed (see Japanese Laid-open Patent Publication No. 2010-113405).

SUMMARY

According to an aspect of the embodiments, an information processing apparatus includes a memory; and a processor coupled to the memory and the processor that creates module partitioning candidates of a plurality of software codes including one or more input nodes from a plurality of input nodes in a data flow graph and calculates a cost corresponding to a bit width of a signal line of the module partitioning candidates for each of the created plurality of module partitioning candidates, and selects one or more module partitioning candidates having a given cost from the plurality of module partitioning candidates as a partitioning target module based on the calculated cost.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3A is a diagram illustrating a specific example of software code, and FIG. 3B is a diagram illustrating a specific example of a data flow graph to be partitioned into modules generated from the software code illustrated in FIG. 3A;

FIG. 4A is a diagram illustrating a module partitioning result of the data flow graph illustrated in FIG. 3B based on the original description of the software code illustrated in FIG. 3A, and FIG. 4B is a diagram illustrating an optimum module partitioning result of the data flow graph illustrated in FIG. 3B according to the present embodiment;

DESCRIPTION OF EMBODIMENTS

Figure 1:
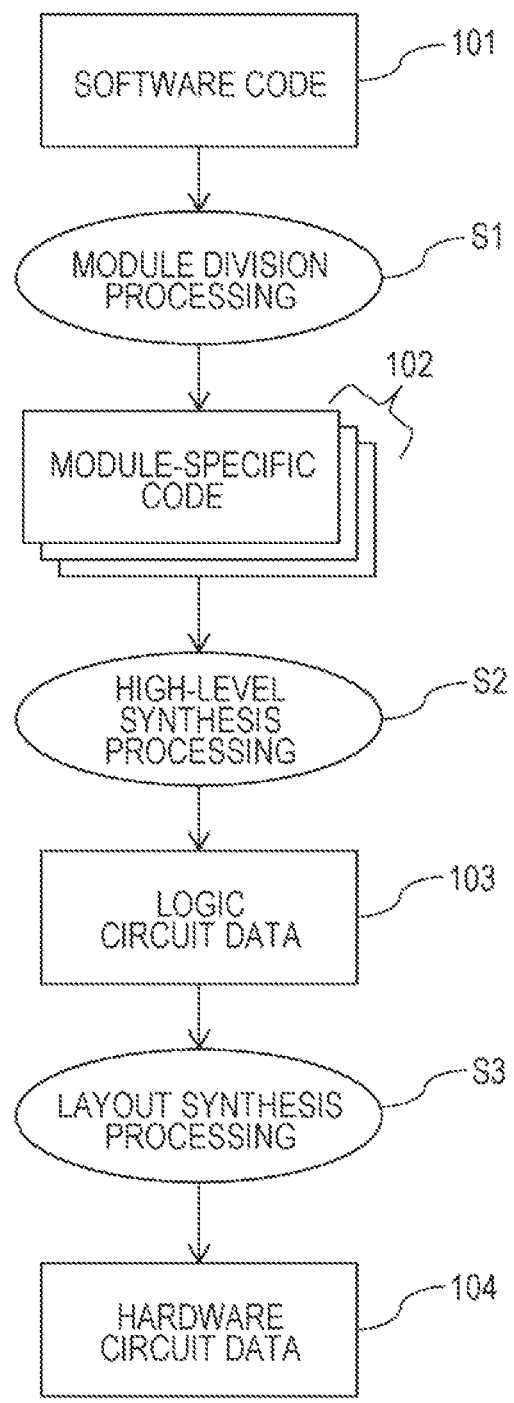
FIG. 1 is a flowchart illustrating an acceleration step.

In the related technique described above, a partitioning target is limited to known function modules registered in advance. For this reason, it is difficult to perform optimum module partitioning.

In addition, in the latter technique described above, at the time of division, the averaging of the path lengths of two modules and the number of cuts between the modules are taken into account, but the number of cuts in an entire data flow graph is not considered. Therefore, there is no guarantee that the number of cuts of the entire data flow graph will be optimal, and it is difficult to perform optimum module partitioning.

Embodiments of an information processing apparatus, a program, and an information processing method disclosed in the present application will be described in detail below with reference to drawings. However, the following embodiment is merely an example, and there is no intention to exclude the application of various modifications and techniques not explicitly described in the embodiment. For example, the present embodiment may be implemented with various modifications without departing from the gist thereof. In addition, each drawing is not intended to include only the components illustrated in the drawing but may include other functions. In each of the embodiments, it is possible to combine functions appropriately as long as the functions do not contradict the processing contents.

[1] Outline of Present Embodiment

The outline of the present embodiment will be described with reference to FIG. 1 to FIG. 4B. As described above, there is a limit to a circuit scale that may be handled by a high-level synthesis tool. Therefore, as illustrated in FIG. 1, acceleration including module partitioning processing (step S1) is executed. FIG. 1 is a flowchart (steps S1 to S3) for describing an acceleration step.

In the acceleration step, by the module partitioning processing (step S1), given software code 101 is partitioned into a plurality of modules of appropriate sizes, for example, a plurality of module-specific code 102. High-level synthesis processing (step S2) is performed on each partitioned module-specific code 102. Then, logic circuit data 103, which is a high-level synthesis result obtained for each of the module-specific code 102, is synthesized with hardware circuit data 104 by layout synthesis processing (step S3). In this way, the software code is converted to hardware.

The technique disclosed in the present embodiment is applied to the module partitioning processing (step S1) in the acceleration step described above.

Figures 2A, 2B, 2C:
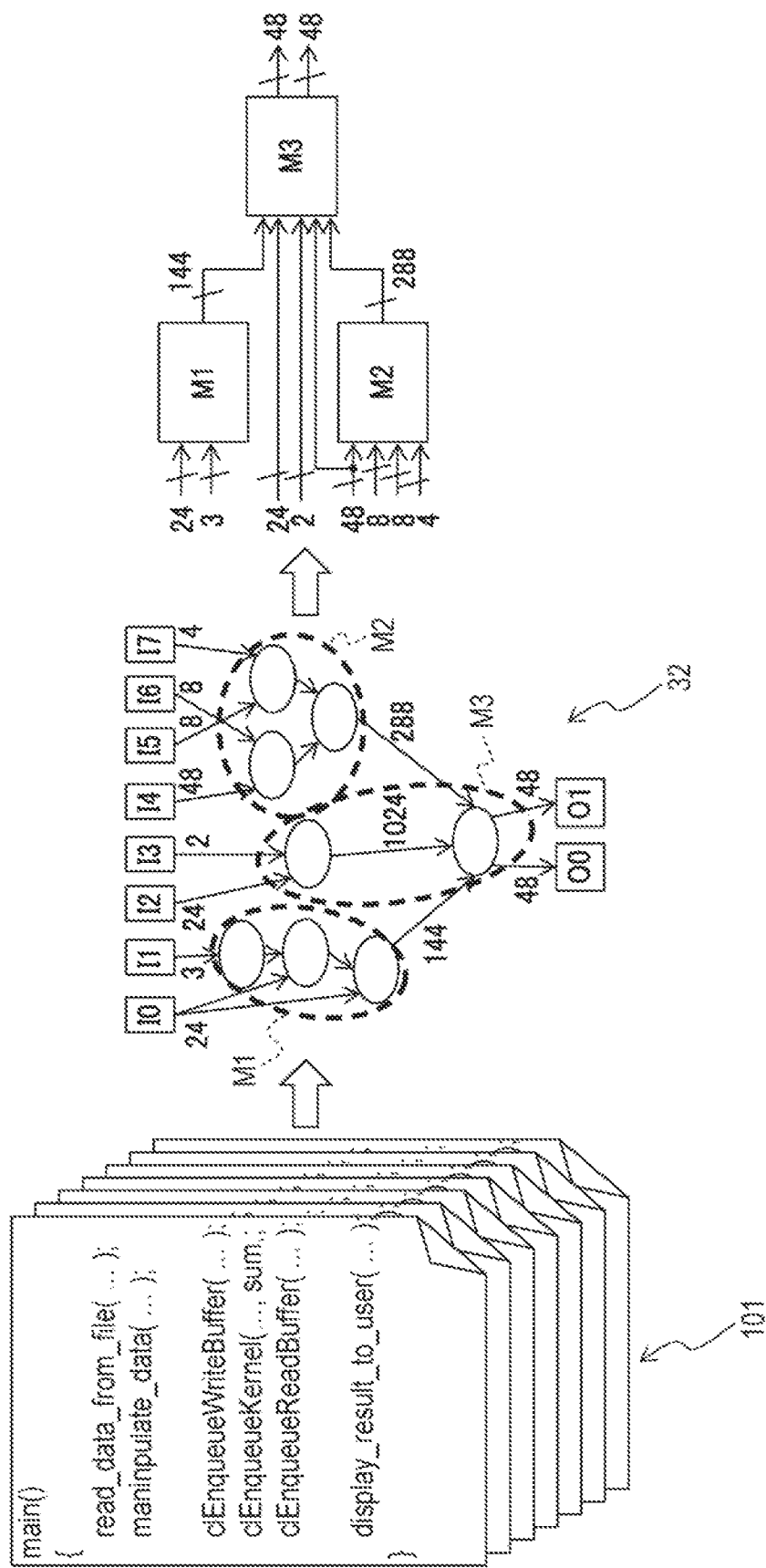
FIG. 2A is a diagram illustrating an example of software code.
FIG. 2B is a diagram illustrating an example of a data flow graph to be partitioned into modules to be generated from the software code illustrated in FIG. 2A.
FIG. 2C is a diagram illustrating an example of a module partitioning result suitable for high-level synthesis of the data flow graph illustrated in FIG. 2B.

Examples of module partitioning suitable for high-level synthesis performed in step S1 are illustrated in FIGS. 2A to 2C. FIG. 2A is a diagram illustrating an example of software code ("high-level synthesis target description", high-level synthesis target description includes a high-level synthesis language) 101. FIG. 2B is a diagram illustrating an example of a data flow graph 32 to be partitioned into modules to be generated from the software code 101 illustrated in FIG. 2A. FIG. 2C is a diagram illustrating an example of a module partitioning result suitable for high-level synthesis of the data flow graph 32 illustrated in FIG. 2B.

The software code 101 as illustrated in FIG. 2A is not suitable for high-level synthesis as it is. Therefore, the software code 101 is converted into the data flow graph 32 as illustrated in FIG. 2B by a compiler or the like, and in the present embodiment, the data flow graph 32 is analyzed, and intermediate nodes in the data flow graph 32 are partitioned into a plurality of modules in consideration of the performance of an entire circuit to be designed. As will be described later, the data flow graph 32 may be grasped as information indicating the execution order of arithmetic operations generated from the software code 101.

In FIG. 2B, I0 to I7 are leaf nodes (also referred to as input nodes) representing input data, and O0 and O1 are leaf nodes (also referred to as output nodes) representing output data. In addition, an ellipse indicated by a thin solid line indicates an intermediate node representing arithmetic processing. The data flow graph 32 illustrated in FIGS. 2A and 2B includes eight intermediate nodes. In addition, in the data flow graph 32, the thin arrow between the above-described nodes is a directed edge representing the data dependency between the nodes.

The numerical value attached to the directed edge is a value corresponding to the wiring width (the wiring width is called bit width) of the signal line between the nodes connected by the directed edge. In the present embodiment, the numerical value indicates a weight (cost) when the directed edge traverses a partitioning boundary by module partitioning, and the weight is a value corresponding to the wiring width of the signal line as described later. The signal line may include a set of wirings. In the present embodiment, using the above numerical values, the intermediate nodes in the data flow graph 32 are partitioned into, for example, three modules M1, M2, and M3 (see a region enclosed by a bold broken line) as illustrated in FIG. 2B.

By performing such module partitioning, the circuit scale and the number of inputs and outputs of each module M1, M2, and M3 after partitioning become appropriate. Therefore, as illustrated in FIG. 2C, it is possible for each module M1, M2, and M3 to generate a circuit with the capability of a high-level synthesis tool maximized.

Here, the influence of module partitioning on the result of layout synthesis will be briefly described. In a case where high-level synthesis and layout synthesis are performed without module partitioning, signal lines are crowded in a wiring area and a large number of unwired lines are generated, and the result of the layout synthesis is likely to fail. On the other hand, in a case where high-level synthesis and layout synthesis are performed after module partitioning, as illustrated in FIG. 2B, module partitioning is performed in consideration of data flow. Therefore, the degree of congestion of the signal lines in the wiring area is not increased, all the signal lines may be wired with an appropriate wiring length, and the possibility that an appropriate one is obtained as a result of the layout synthesis increases.

Therefore, in the present embodiment, in a module partitioning problem in which a data flow graph is input, the total number of cuts described later is used as a cost, and the module partitioning in which the cost is the minimum (given cost) is selected as an output. In the following, the data flow graph may be abbreviated as DFG in some cases. In the present embodiment, in order to simplify the description, a graph not having a DFG loop (acyclic) is targeted, but it is possible to expand and apply the technique according to the present invention to a case having a loop.

Here, with reference to FIGS. 3A and 3B, the software code 101 which a high-level synthesis target description and specific examples of the DFG 32 to be partitioned into modules generated from the software code 101 will be described. FIG. 3A is a diagram illustrating a specific example of the software code 101, and FIG. 3B is a diagram illustrating a specific example of the data flow graph 32 to be partitioned into modules generated from the software code 101 illustrated in FIG. 3A.

In the software code 101 illustrated in FIG. 3A, the data arrays A[3][6], B[6][3], x[3], y[3], z[3] of a float type which is a fixed floating point data type of C language are defined, arithmetic processing z=A*(B*x)+y is defined based on the data arrays.

As illustrated in FIG. 3B, the DFG 32 generated from the software code 101 illustrated in FIG. 3A includes four leaf nodes I1 to I4 as input nodes and one leaf node O0 as an output node. The leaf nodes I1 to I4 and O0 correspond to data arrays A[3][6], B[6][3], x[3], y[3], z[3], respectively. The entity of the leaf node in the DFG 32 is an external terminal of the circuit, a register/memory element or the like used for exchanging data with an upper hierarchical circuit and expresses the interface of data with the outside world as a concept.

In addition, the DFG 32 includes three intermediate nodes P1 to P3 representing arithmetic processing. The intermediate node P1 represents multiplication processing of B[6][3] from a leaf node I2 and x[3] from a leaf node I3. The intermediate node P2 represents multiplication processing of A[3][6] from the leaf node I1 and the multiplication result B[6][3]*x[3] from the intermediate node P1. The intermediate node P3 represents addition processing of the multiplication results A[3][6]*(B[6][3]*x[3]) from the intermediate node P1 and y[3] from the leaf node I4. Therefore, the leaf node O0 corresponding to the data array z[3] is the output from the intermediate node P3, for example, the output from A[3][6]*(B[6][3]*x[3])+y[3].

Also in the DFG 32 illustrated in FIG. 3B, thin arrows between the nodes are directed edges E1 to E7 representing data dependency between the nodes. Each of the edges E1 to E7 in the DFG 32 has a value corresponding to the wiring width of data flowing between the nodes, that is, the wiring width of the signal line as a weight. In the diagram, the numbers attached to the edges E1 to E7 represent weights.

In the present embodiment, for example, the number of float variables is used as a value corresponding to the wiring width of data flowing between the nodes. Since the float type arithmetic operation is performed with 32 bits, the actual wiring width is the number of float variables ×32 bits, but for simplicity, as described above, the number of float variables is used as a weight.

For example, in FIG. 3B, a weight 3×6=18 is given to the directed edge E1 from the leaf node I1 to the intermediate node P2, and a weight 3×6=18 is assigned to the directed edge E2 from the leaf node I2 to the intermediate node P1. In addition, a weight 3 is assigned to the directed edge E3 from the leaf node I3 to the intermediate node P1, and a weight 3 is assigned to the directed edge E4 from the leaf node I4 to the intermediate node P3. Further, a weight 18/3=6 is assigned to the directed edge E5 from the intermediate node P1 to the intermediate node P2, and a weight 18/6=3 is assigned to the directed edge E6 from the intermediate node P2 to the intermediate node P3. Then, a weight 3 is assigned to the directed edge E7 from the intermediate node P3 to the leaf node O0.

Here, in the present embodiment, the term "module partitioning" means to partition a node set of the entire DFG into a plurality of subsets (modules) to be connected to each other. In addition, as the cost for each module (for each module partitioning candidate), "total number of cuts" is used. The "total number of cuts" is defined as the total sum of the weights assigned to all the edges traversed by a module boundary. In other words, the "total number of cuts" is defined as the total sum of the weights assigned to a plurality of edges traversing the boundary (partitioning boundary of module partitioning candidate) of the module.

At this time, the case of partitioning the DFG 32 illustrated in FIG. 3B into two modules will be considered with reference to FIGS. 4A and 4B. FIG. 4A is a diagram illustrating a module partitioning result of the DFG 32 illustrated in FIG. 3B based on the original description of the software code 101 illustrated in FIG. 3A. In addition, FIG. 4B is a diagram illustrating an optimum module partitioning result of the DFG 32 illustrated in FIG. 3B according to the technique of the present embodiment.

In FIG. 4A, a result of partitioning the DFG 32 illustrated in FIG. 3B into two modules M1a and M2a is illustrated based on the original description of the software code 101 illustrated in FIG. 3A. In the partitioning result illustrated in FIG. 4A, since the edges E1 to E5, and E7 traverse the boundaries of the modules M1a and M2a, the total number of cuts (cost) is 18+18+3+3+6+3=51, and the number of module stages is 2. The number of module stages is defined as the maximum number of modules existing on a path from an input side leaf node to an output side leaf node and may be regarded as a numerical value corresponding to the data processing time by a partitioned module. In addition, hereinafter, the number of module stages may be simply described as the number of stages.

On the other hand, in FIG. 4B, the result of optimally partitioning the DFG 32 illustrated in FIG. 3B into two modules M1b and M2b is illustrated by using the technique of the present embodiment. In the partitioning result illustrated in FIG. 4B, since the edges E1 to E4, and E6 and E7 traverse the boundaries of the modules M1b and M2b, the total number of cuts (cost) is 18+18+3+3+3+3=48, and the number of module stages is 2.

For example, the total number of cuts of the partitioning result illustrated in FIGS. 4A and 4B are 51 and 48, respectively. Therefore, it may be said that the wiring property between the modules M1b and M2b is excellent because the partitioning result illustrated in FIG. 4B has a smaller total number of cuts (cost is smaller).

In addition, the numbers of module stages of the partitioning result illustrated in FIGS. 4A and 4B are both 2.

Therefore, assuming that the data processing time for each module is equal, it may be said that the circuit delay in the partitioning result illustrated in FIGS. 4A and 4B is the same.

Therefore, in the present embodiment, in order to obtain the optimum module partitioning result of the DFG as illustrated in FIG. 4B, the following processing is executed by, for example, a computer (see reference numeral 10 in FIGS. 5 and 6) or the like.

In the present embodiment, first, processing for creating a plurality of module partitioning candidates including one or more of the above-described nodes is executed from nodes that are a plurality of operation units in the DFG. Thereafter, processing is performed for calculating the cost corresponding to the wiring width of the signal line of the module partitioning candidate with respect to each of the plurality of created module partitioning candidates. Then, processing of selecting one or more module partitioning candidates having a given cost as a partitioning target module from the plurality of module partitioning candidates is executed based on the calculated cost. At this time, it is preferable to execute the processing of calculating the cost of a module partitioning candidate in a topological order from the module partitioning candidates on the input side in the DFG.

Here, the given cost may be the minimum cost. In addition, as described above, the cost calculated for each module partitioning candidate is the total sum (the total number of cuts) of the weights assigned to the plurality of edges traversing the boundary of each module partitioning candidate, and the weight may be a value corresponding to the wiring width of the signal line corresponding to the weighted edge.

Further, a constraint condition for each module partitioning candidate is preset, and processing of creating a module partitioning candidate that satisfies the constraint condition or selecting a module partitioning candidate that satisfies the constraint condition as a partitioning target module may be executed. At this time, the constraint condition may be at least one of the number of the nodes included in each module partitioning candidate, an area of each module partitioning candidate, and a throughput of each module partitioning candidate.

By executing the above-described processing, a plurality of module partitioning candidates are created from the DFG, a total number of cuts (cost) is obtained for each module partitioning candidate, and a module partitioning candidate having a given total number of cuts is selected. As a result, it is possible to perform optimum module partitioning without depending on the skill of the user. In addition, it is possible to reduce the calculation amount for calculating the cost by calculating the cost in the topological order.

Figure 5:
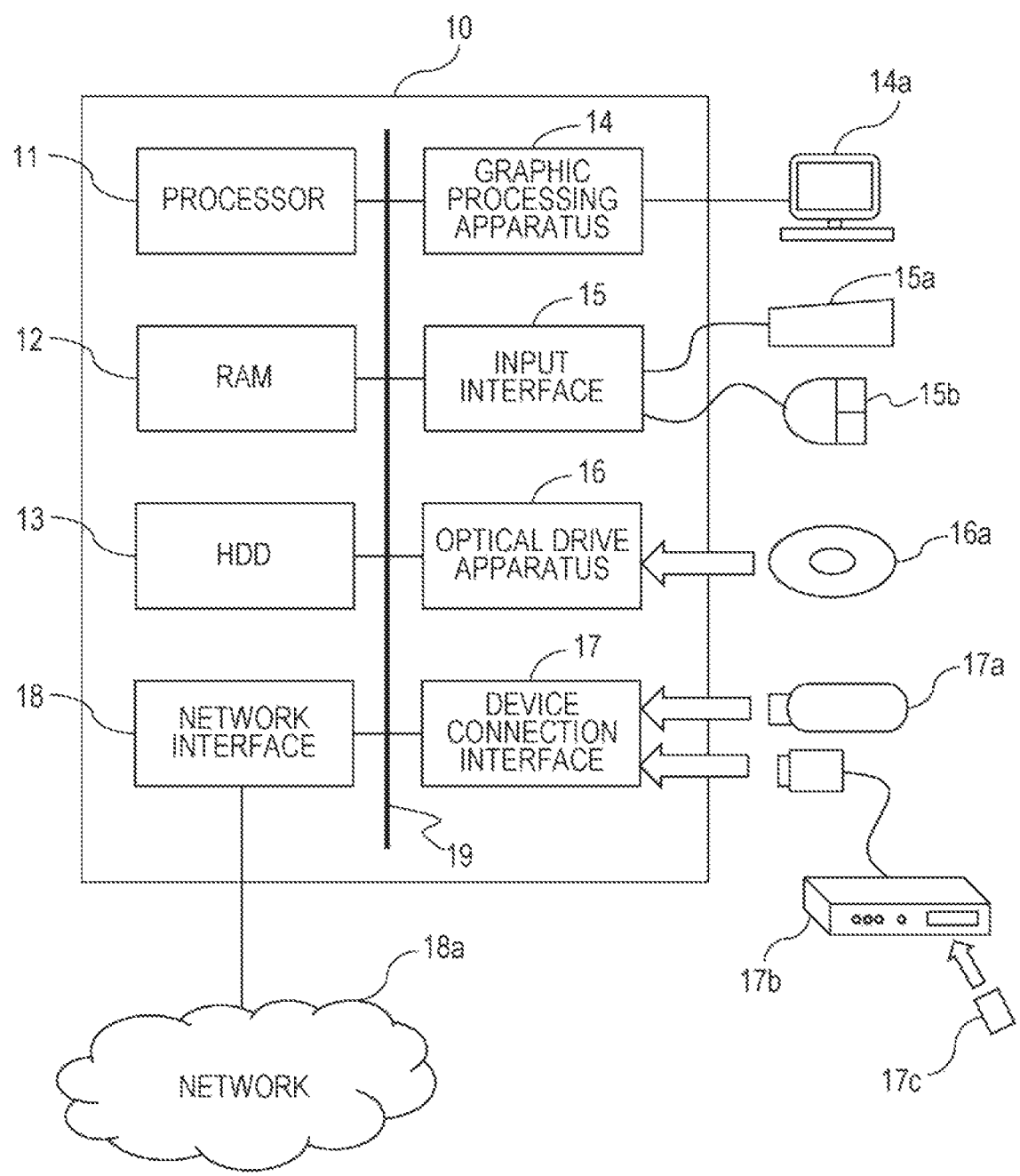
FIG. 5 is a block diagram illustrating an example of a hardware configuration of an information processing apparatus according to an embodiment of the present invention.

[2] Hardware Configuration of Information Processing Apparatus of Present Embodiment First, with reference to FIG. 5, a hardware configuration of an information processing apparatus (computer) 10 of the present embodiment will be described. FIG. 5 is a block diagram illustrating an example of the hardware configuration.

The computer 10 includes, for example, a processor 11, a random access memory (RAM) 12, a hard disk drive (HDD) 13, a graphic processing apparatus 14, an input interface 15, an optical drive apparatus 16, a device connection interface 17, and a network interface 18. These components 11 to 18 are configured to communicate with each other via a bus 19.

A processor (processing unit) 11 controls the entire computer 10. The processor 11 may be a multiprocessor. The processor 11 may be any one of, for example, a CPU, micro processing unit (MPU), digital signal processor (DSP), application specific integrated circuit (ASIC), programmable logic device (PLD), and FPGA. In addition, the processor 11 may be a combination of two or more elements of CPU, MPU, DSP, ASIC, PLD, and FPGA. The CPU may be a single CPU, multi-CPUs, or multi-core CPUs.

The RAM (storage unit) 12 is used as a main storage apparatus of the computer 10. In the RAM 12, at least a part of an operating system (OS) program and an application program to be executed by the processor 11 is temporarily stored. In addition, various data for processing by the processor 11 is stored in the RAM 12. The application program may include a program (see reference numeral 31 in FIG. 6) executed by the processor 11 to realize the module partitioning function of the embodiment by the computer 10.

The HDD (storage unit) 13 magnetically writes and reads data to and from the built-in disk. The HDD 13 is used as an auxiliary storage apparatus of the computer 10. The HDD 13 stores an OS program, an application program, and various data. As the auxiliary storage apparatus, it is also possible to use storage class memory (SCM) or a semiconductor storage apparatus (SSD: Solid State Drive) such as flash memory.

A monitor (display unit, output unit) 14a is connected to the graphic processing apparatus 14. The graphic processing apparatus 14 displays an image on the screen of the monitor 14a according to a command from the processor 11. Examples of the monitor 14a include a display apparatus using a cathode ray tube (CRT), a liquid crystal display apparatus, and the like.

To the input interface 15, a keyboard 15a and a mouse 15b are connected. The input interface 15 transmits signals sent from the keyboard 15a and the mouse 15b to the processor 11. The mouse 15b is an example of a pointing device, and other pointing devices may be used. Examples of other pointing devices include a touch panel, a tablet, a touch pad, a track ball, and the like.

The optical drive apparatus 16 reads data recorded on an optical disk 16a by using laser light or the like. The optical disk 16a is a portable non-transitory recording medium in which data is recorded so as to be readable by reflection of light. Examples of the optical disk 16a include digital versatile disc (DVD), DVD-RAM, compact disc read only memory (CD-ROM), CD-recordable (R)/rewritable (RW), and the like.

The device connection interface 17 is a communication interface for connecting peripheral devices to the computer 10. For example, to the device connection interface 17, a memory device 17a and a memory reader/writer 17b may be connected. The memory device 17a is a non-transitory recording medium having a communication function with the device connection interface 17, for example, a Universal Serial Bus (USB) memory. The memory reader/writer 17b writes data to a memory card 17c or reads data from the memory card 17c. The memory card 17c is a card-type non-transitory recording medium.

The network interface 18 is connected to a network 18a. The network interface 18 exchanges data with another computer or a communication device via the network 18a.

With the computer 10 having the hardware configuration as described above, it is possible to realize the module partitioning function of the present embodiment described later with reference to FIGS. 6 to 17.

The computer 10 implements the module partitioning function of the present embodiment by executing a program (such as a program 31 to be described later) recorded on a computer readable non-transitory recording medium, for example. A program describing processing contents to be executed by the computer 10 may be recorded on various recording media. For example, a program to be executed by the computer 10 may be stored in the HDD 13. The processor 11 loads at least a part of the program in the HDD 13 into the RAM 12 and executes the loaded program.

In addition, a program to be executed by the computer 10 (the processor 11) may also be recorded in a non-transitory portable recording medium such as the optical disk 16a, the memory device 17a, the memory card 17c, and the like. The program stored in the portable recording medium becomes executable after being installed in the HDD 13 under the control of the processor 11, for example. In addition, the processor 11 may read and execute the program directly from the portable recording medium.

Figure 6:
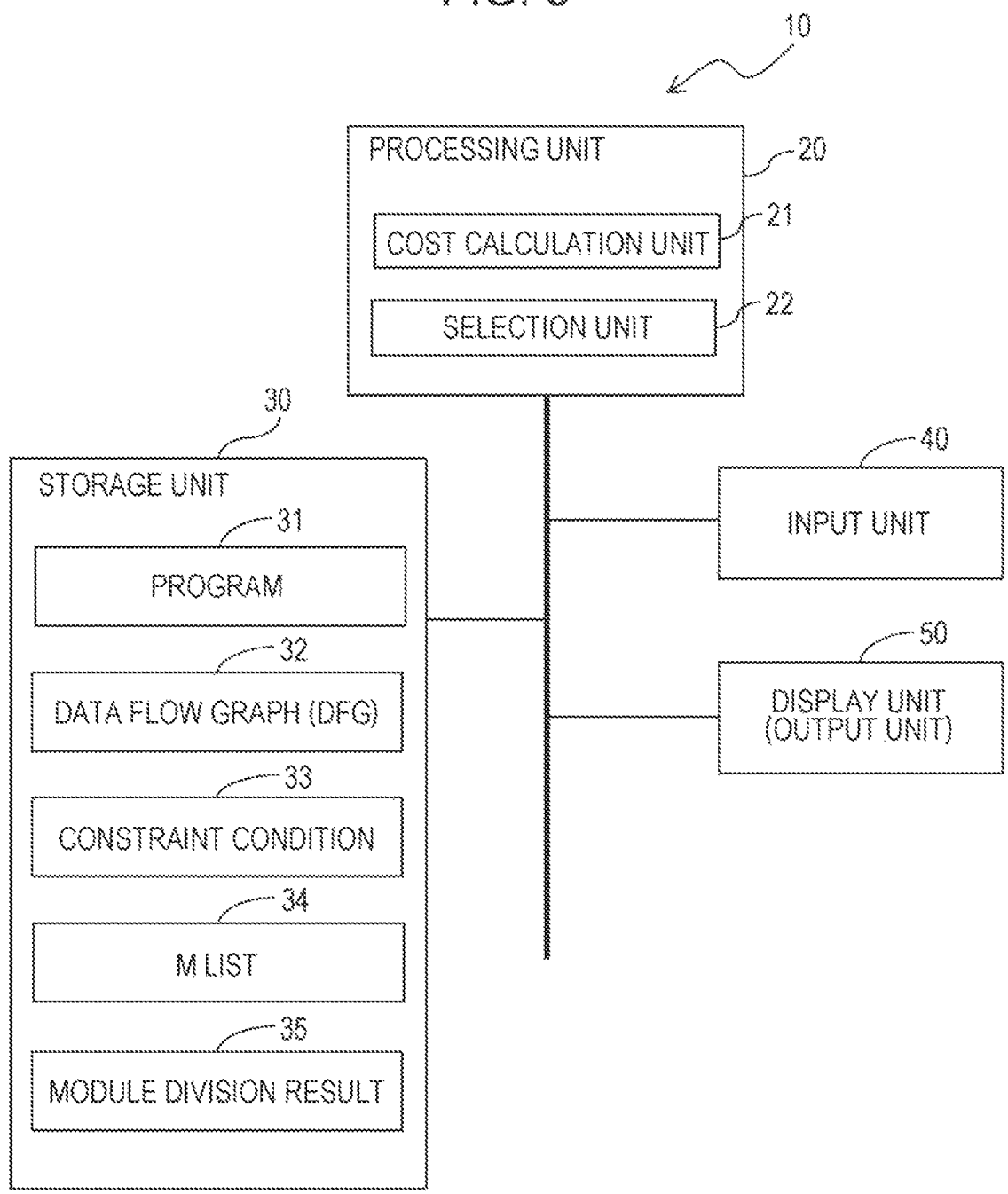
FIG. 6 is a block diagram illustrating an example of a functional configuration of the information processing apparatus according to the embodiment of the present invention.
Figure 7:
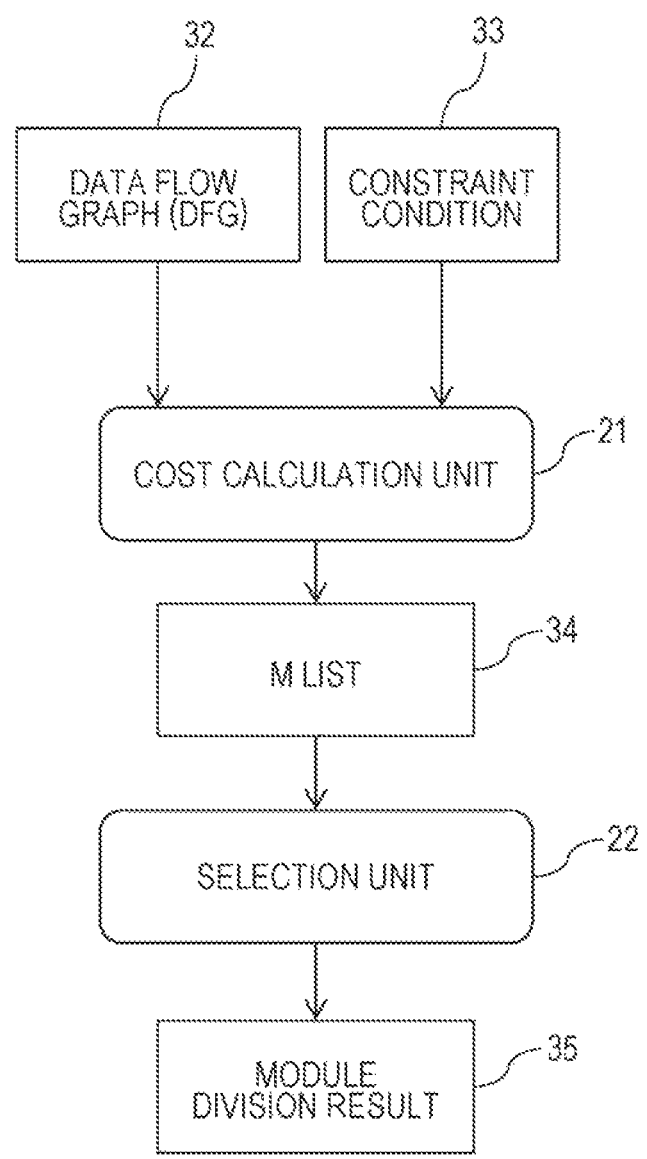
FIG. 7 is a block diagram for more specifically describing the functional configuration of the information processing apparatus illustrated in FIG. 6.

[3] Functional Configuration of Information Processing Apparatus of Present Embodiment Next, the functional configuration of the information processing apparatus (computer) 10 of the present embodiment will be described with reference to FIGS. 6 and 7. FIG. 6 is a block diagram illustrating an example of the functional configuration, and FIG. 7 is a block diagram for more specifically describing the functional configuration of the information processing apparatus 10 illustrated in FIG. 6.

The computer 10 analyzes the DFG 32 converted from the software code 101 by a compiler or the like and performs the function (module partitioning function) of partitioning the intermediate nodes in the DFG 32 into a plurality of modules in consideration of the performance of the entire circuit to be designed. Therefore, as illustrated in FIG. 6, the computer 10 has at least functions as a processing unit 20, a storage unit 30, an input unit 40, and a display unit 50.

The processing unit 20 is, for example, a processor 11 as illustrated in FIG. 5. By executing the program 31, the processing unit 20 functions as a cost calculation unit 21 and a selection unit 22 which will be described later.

The storage unit 30 is, for example, the RAM 12 and the HDD 13 as illustrated in FIG. 5, and stores and saves various kinds of information for realizing the module partitioning function. In addition to the above-described program 31 and DFG 32, the various kinds of information include a constraint condition 33, an M list (module list) 34, a module partitioning result 35, and the like which will be described later.

Here, as described above, the program 31 causes the processing unit 20 (processor 11) to execute functions as the cost calculation unit 21 and the selection unit 22, which will be described later.

In addition, as described above, the DFG 32 is obtained by being converted from the software code 101 by a compiler or the like.

The input unit 40 is, for example, the keyboard 15a and the mouse 15b as illustrated in FIG. 5, and is operated by a user to issue various instructions concerning module partitioning. Instead of the mouse 15b, a touch panel, a tablet, a touch pad, a track ball or the like may be used.

The display unit 50 is, for example, a monitor 14a as illustrated in FIG. 5, and the display state thereof is controlled by a display control unit (not illustrated) via the graphic processing apparatus 14. In the present embodiment, the display unit 50 displays and outputs, for example, the DFG 32 and the module partitioning result 35 of the DFG 32.

As illustrated in FIG. 7, the input to the computer 10 that performs the module partitioning function of the present embodiment is the DFG 32 to be partitioned and the constraint condition 33. As will be described later, the constraint condition 33 relates to each module partitioning candidate, which is preset and stored in the storage unit 30. At this time, the constraint condition 33 may be at least one of the number of the nodes (intermediate nodes) included in each module partitioning candidate, an area of each module partitioning candidate, and a throughput of each module partitioning candidate.

In the case of adopting the number of nodes, an upper limit value or a lower limit value of the number of nodes or both are set, and it may be set as the constraint condition 33 that the number of nodes is equal to or less than the upper limit value, the number of nodes is equal to or more than the lower limit value, or the number of nodes is not more than the upper limit value and not less than the lower limit value.

In the case of adopting an area, an upper limit value or a lower limit value of the area or both are set, and it may be set as the constraint condition 33 that the area is equal to or less than the upper limit value, the area is equal to or more than the lower limit value, or the area is not more than the upper limit value and not less than the lower limit value.

Similarly, in the case of adopting a throughput, an upper limit value or a lower limit value of throughput or both are set, and it may be set as the constraint condition 33 that the throughput is equal to or less than the upper limit value, the throughput is equal to or more than the lower limit value, or the throughput is not more than the upper limit value and not less than the lower limit value.

Further, the constraint condition 33 may be set as a request speed for a circuit obtained as a result of module partitioning or an upper limit value or a lower limit value of a module size or both. The request speed may also be regarded as the number of module stages described above. In addition, the module size may also be regarded as the number of nodes (intermediate nodes).

The cost calculation unit 21 has a function of creating a plurality of module partitioning candidates (see, for example, C1 to C3 in FIG. 10A) including one or more nodes from intermediate nodes which are a plurality of operation units in the DFG 32. At this time, the cost calculation unit 21 preferably creates a module partitioning candidate that satisfies the constraint condition 33. In addition, the cost calculation unit 21 calculates the total number of cuts which is the cost of the module partitioning candidate for each of the created plurality of module partitioning candidates.

For example, in the present embodiment, the cost calculation unit 21 obtains the M list 34 that is a list of module partitioning having each intermediate node as a vertex for each intermediate node on the DFG 32. As will be described later, the M list 34 includes information on a node set, a cost (total number of cuts), and an output set for each module partitioning candidate. The M list 34 will be described later with reference to FIGS. 8 to 10C.

The selection unit 22 selects one or more module partitioning candidates having the given cost from the plurality of module partitioning candidates as a partitioning target module based on the cost (M list 34) calculated by the cost calculation unit 21. At this time, the selection unit 22 preferably selects a module partitioning candidate that satisfies the constraint condition 33 as a partitioning target module. The given cost may be the minimum cost. In addition, as described above, the cost calculated for each module partitioning candidate is the total sum (the total number of cuts) of the weights assigned to the plurality of edges traversing the boundary of each module partitioning candidate, and the weight may be a value corresponding to the wiring width of the signal line corresponding to the weighted edge.

For example, in the present embodiment, the selection unit 22 obtains a partitioning target module by back-tracing the module partitioning candidate having the minimum cost for the entire DFG based on the M list 34 of the nodes in a final stage of the DFG 32 and outputs and saves the obtained partitioning target module as the module partitioning result 35.

In the present embodiment, it is preferable to execute the processing of calculating the cost in the topological order from the nodes on the input side in the DFG 32. Here, at the time of calculating the M list 34 for a random node k, the topological order refers to an order in which the M list 34 has been calculated for all nodes that are directly or indirectly input to the node k.

Figure 8:
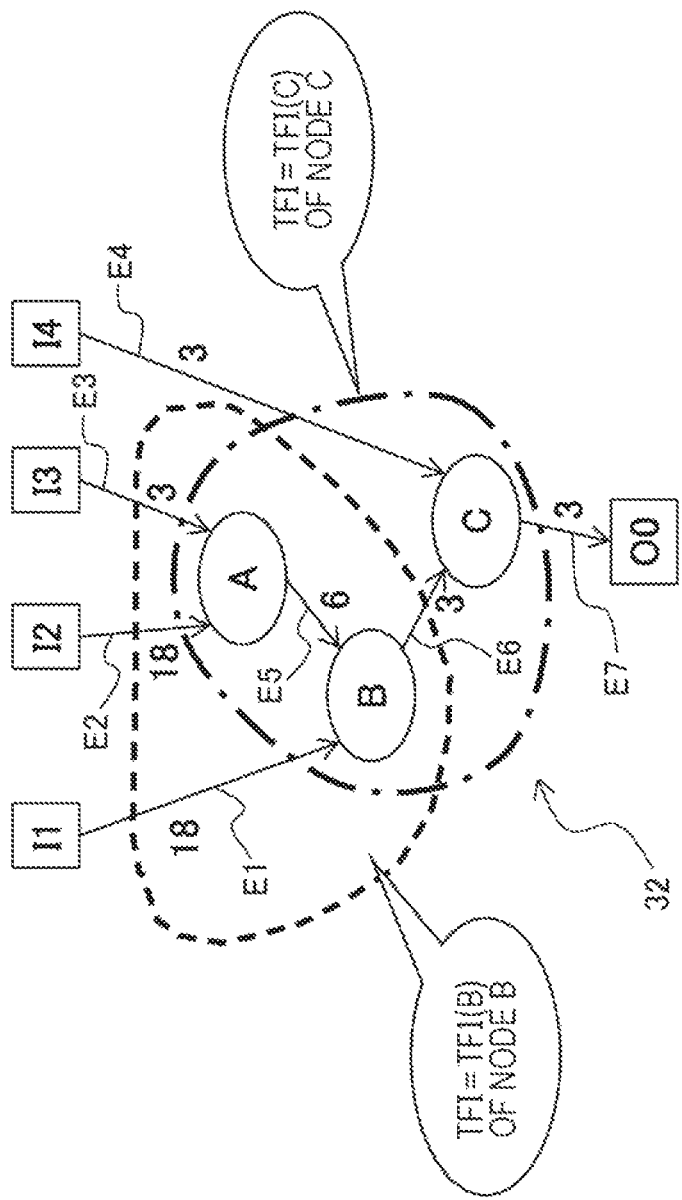
FIG. 8 is a diagram for describing transitive fan-in (TFI) in the present embodiment.

For example, if the intermediate nodes A, B, and C in the DFG 32 illustrated in FIG. 8 are arranged in the topological order, the order becomes A→B→C. In addition, for example, if the intermediate nodes A to F in the DFG 32 illustrated in FIG. 14A are arranged in the topological order, A→B→C→D→E→F, A→B→C→E→D→F, A→C→B→D→E→F, A→C→B→E→D→F, A→B→D→C→E→F, and the like are conceivable.

[4] Operation of Information Processing Apparatus of Present Embodiment

Next, with reference to FIGS. 8 to 13, the M list 34, the module partitioning result 35, and the operations of the cost calculation unit 21 and the selection unit 22 will be described.

[4-1] M List

In the present embodiment, the M list 34 that is module partitioning information including information on a cost (total number of cuts) is created for each intermediate node that is an operation unit in the DFG 32 by the cost calculation unit 21. An intermediate node may be simply referred to as a node.

Here, the M list 34 of the node k is a list of module partitioning candidates having the node k as a vertex.

In addition, in the following, a partial graph of DFG including all nodes belonging to the input side of the node k, for example, all nodes directly or indirectly input to the node k is referred to as "transitive fan-in" of the node k" and is denoted as TFI (k).

For example, as illustrated in FIG. 8, the TFI of a node B, for example, TFIB corresponds to the partial graph in the region surrounded by the thick broken line, and TFIB={A, B}. Similarly, the TFI of a node C, for example, TFIC corresponds to the partial graph in the region surrounded by the one-dot chain line, and TFIC={A, B, C}.

Then, it is possible to assume that the M list 34 of each node other than the node k included in the TFI (k) has already been calculated at the time of calculating the M list 34 of the node k on the premise of the above topological order. For example, in FIG. 8, at the time of calculating the M list 34 of the node B, the M list 34 of a node A in the TFIB has already been calculated. In addition, at the time of calculating the M list 34 of the node C, the M list 34 of the nodes A and B in the TFIC has already been calculated.

Since FIG. 8 is a diagram for explaining the TFI in the present embodiment and the DFG 32 similar to the DFG illustrated in FIGS. 3B, 4A, and 4B is illustrated, the description of the DFG 32 illustrated in FIG. 8 will be omitted. In addition, the intermediate nodes A, B, and C in FIG. 8 correspond to the intermediate nodes P1, P2, P3 in FIGS. 3B, and 4A and 4B respectively.

In the present embodiment, each module partitioning candidate has "node set", "cost", and "output set" as module partitioning information in the M list 34.

"node set" is a set of nodes included in a module partitioning candidate having the node k as a vertex.

"cost" is the total cost of TFI (k) when adopting a module partitioning candidate.

"output set" is a set of vertex nodes of modules in TFI (k) when adopting the module partitioning candidate. Information on this output set is used for determining and deleting module partitioning candidates to be dominated as described later.

Figure 9B:
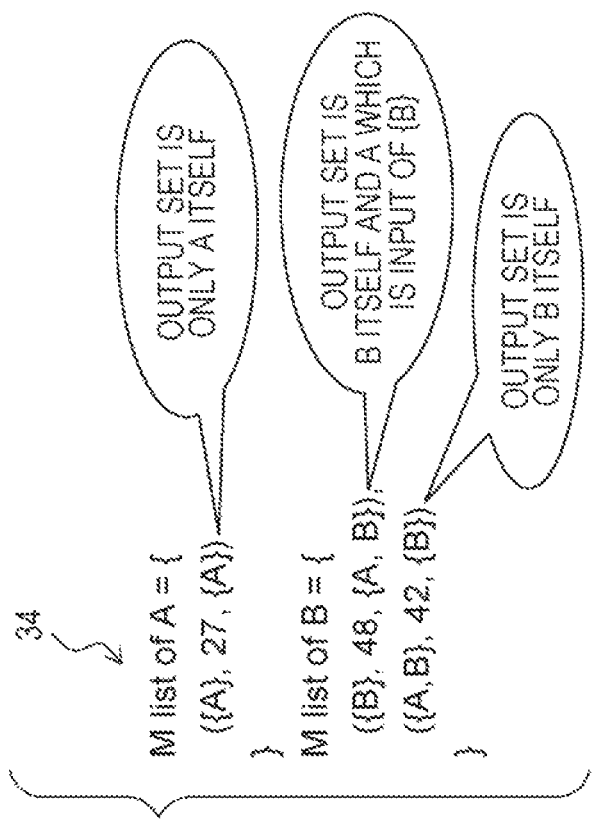
FIG. 9B is a diagram illustrating M lists of nodes A and B in the data flow graph illustrated in FIG. 9A.
Figure 9A:
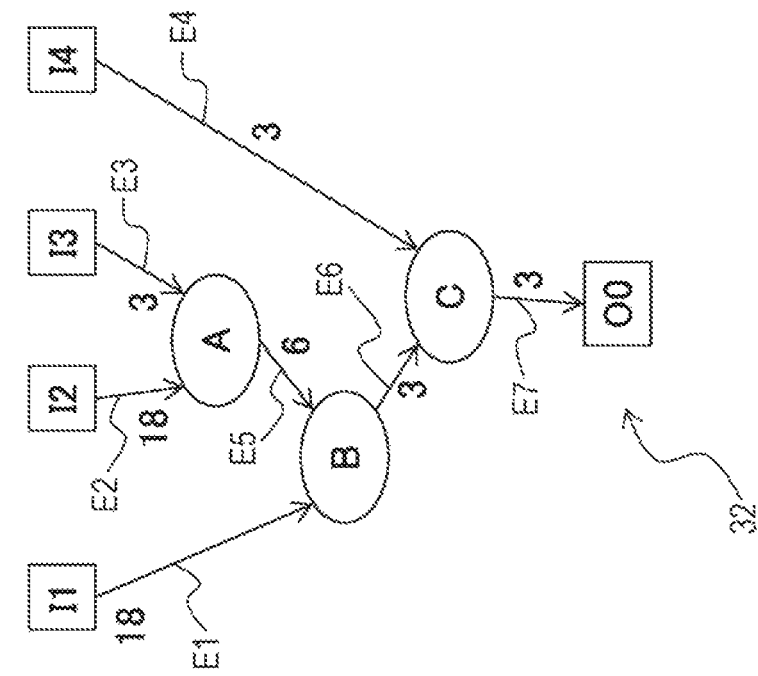
FIG. 9A is a diagram illustrating an example of a data flow graph to be partitioned into modules.

Here, with reference to FIGS. 9A and 9B, the calculation creation of the M list 34 of the node A and the node B in the DFG 32 illustrated in FIG. 9A will be described. FIG. 9A is a diagram illustrating an example of the DFG 32 to be partitioned into modules. FIG. 9B is a diagram illustrating the M list 34 of the nodes A and B in the DFG 32 illustrated in FIG. 9A. The DFG 32 illustrated in FIG. 9A is the same as the DFG 32 illustrated in FIG. 8, so the description thereof will be omitted.

The M list 34 for one intermediate node is denoted as {({node set}, cost, {output set}), . . . } as illustrated in FIG. 9B.

For each intermediate node, one or more module partitioning candidates are created. Then, the module partitioning information ({node set}, cost, {output set}) included in the M list 34 is created for each module partitioning candidate.

At this time, the cost is defined as the total number of cuts of the module partitioning on the input side over the target node, for example, the total sum of the weights assigned to all the edges traversed by the module boundary. In addition, the output set indicates the possibility that the module partitioning candidate may be input to another module.

For the node A illustrated in FIG. 9A, a node set of module partitioning candidates is only one set of {A}. At this time, as illustrated in FIG. 9B, the total number of cuts which is the cost of a module partitioning candidate {A} is 18+3+6=27. In addition, the output set of module partitioning candidate {A} is a set of vertex nodes of modules in TFIA={A}, which is only {A}.

For the node B illustrated in FIG. 9A, the node set of module partitioning candidates is two sets of {B} and {A, B}.

At this time, as illustrated in FIG. 9B, the total number of cuts which is the cost of a module partitioning candidate {B} is 18+27+3=48. In addition, the output set of the module partitioning candidate {B} is the set {A, B} of the vertex nodes of the modules in TFIB={A, B}. If the module partitioning candidate is {B}, the node B itself is a single module. For this reason, a module having the node A, which is the input of the node B, as a vertex is deserved for the module partitioning candidate {B}, and the node A is also included in the output set.

In addition, as illustrated in FIG. 9B, the total number of cuts which is the cost of the module partitioning candidates {A, B} is 18+18+3+3=42, and the output set of module partitioning candidates {A, B} is a set of vertex nodes of modules in TFIB={A, B}, which is only {B}.

[4-2] Operation of Cost Calculation Unit

Here, the operation of the cost calculation unit 21 in the information processing apparatus 10 of the present embodiment will be described according to the flowchart (steps S11 to S19) illustrated in FIG. 12. The cost calculation unit 21 calculates and creates the M list 34 for the target node k by treating the intermediate node in the topological order from the intermediate nodes on the input side in the DFG 32 as the target node k and performing the processing according to the flowchart illustrated in FIG. 12 on the target node k.

First, the cost calculation unit 21 enumerates all module partitioning candidates having the target node k as a vertex (step S11). By performing the processing in the topological order, the M list 34 of all the nodes on the input side than the target node has already been calculated and created.

The cost calculation unit 21 selects one of the enumerated one or more module partitioning candidates as a target module partitioning candidate to acquire a set FI of intermediate nodes which are direct inputs to the selected target module partitioning candidate (step S12). The set FI is referred to as an input node set FI.

The cost calculation unit 21 extracts the M list 34 of each intermediate node in the input node set FI and sets a combination of the target module partitioning candidate and each intermediate node of the input node set FI as TFI (k) (step S13).

Then, the cost calculation unit 21 calculates the minimum cost of the target module partitioning candidate based on the M list 34 of each intermediate node in the input node set FI and registers the calculated minimum cost in the M list 34 of the target module partitioning candidate (step S14).

At this time, the cost calculation unit 21 calculates the number of cuts on the output side of the target module partitioning candidate, the number of cuts of the input side leaf node of the target module partitioning candidate, and the minimum cost in the M list 34 of each intermediate node in the input node set FI as the minimum cost.

Here, the number of cuts on the output side of the target module partitioning candidate is the sum of the weights assigned to the edges traversing the partitioning boundary on the output side of the target module partitioning candidate. In addition, the number of cuts of the input side leaf node of the target module partitioning candidate is the sum of the weights assigned to the edges traversing the partitioning boundary between the target module partitioning candidate and the input side leaf node.

In addition, the cost calculation unit 21 registers the merged set of the target node k and the output set of the module partitioning candidate having the minimum cost out of the M list 34 of each intermediate node in the input node set FI in the M list 34 of the target module partitioning candidate as an output set of the target module partitioning candidate (step S15).

Then, the cost calculation unit 21 determines whether or not the processing of steps S12 to S15 has been performed on all of the module partitioning candidates enumerated in step S11 (step S16). In a case where there is an unprocessed module partitioning candidate (NO route in step S16), the cost calculation unit 21 selects a next unprocessed module partitioning candidate (step S17) and returns to the processing of step S12.

On the other hand, in a case where there is no unprocessed module partitioning candidate (YES route of step S16), the cost calculation unit 21 deletes a module partitioning candidate that does not satisfy the preset constraint condition 33 (step S18). When enumerating module partitioning candidates in step S11, the cost calculation unit 21 may delete a module partitioning candidate that does not satisfy the constraint condition 33, for example, the condition regarding the number of intermediate nodes belonging to the module partitioning candidate.

Finally, the cost calculation unit 21 deletes a module partitioning candidate that satisfies the constraint condition 33 but is dominated by another module partitioning candidate (step S19) and ends the processing. Here, "module partitioning candidate that is dominated by another module partitioning candidate" refers to a module partitioning candidate in which there is another module partitioning candidate in which the cost is small and the output set is the same or inclusive. In this manner, the cost calculation unit 21 creates the M list 34 including module partitioning candidates excluding the module partitioning candidates that do not satisfy the constraint condition 33 and the module partitioning candidates that are dominated.

Figure 12:
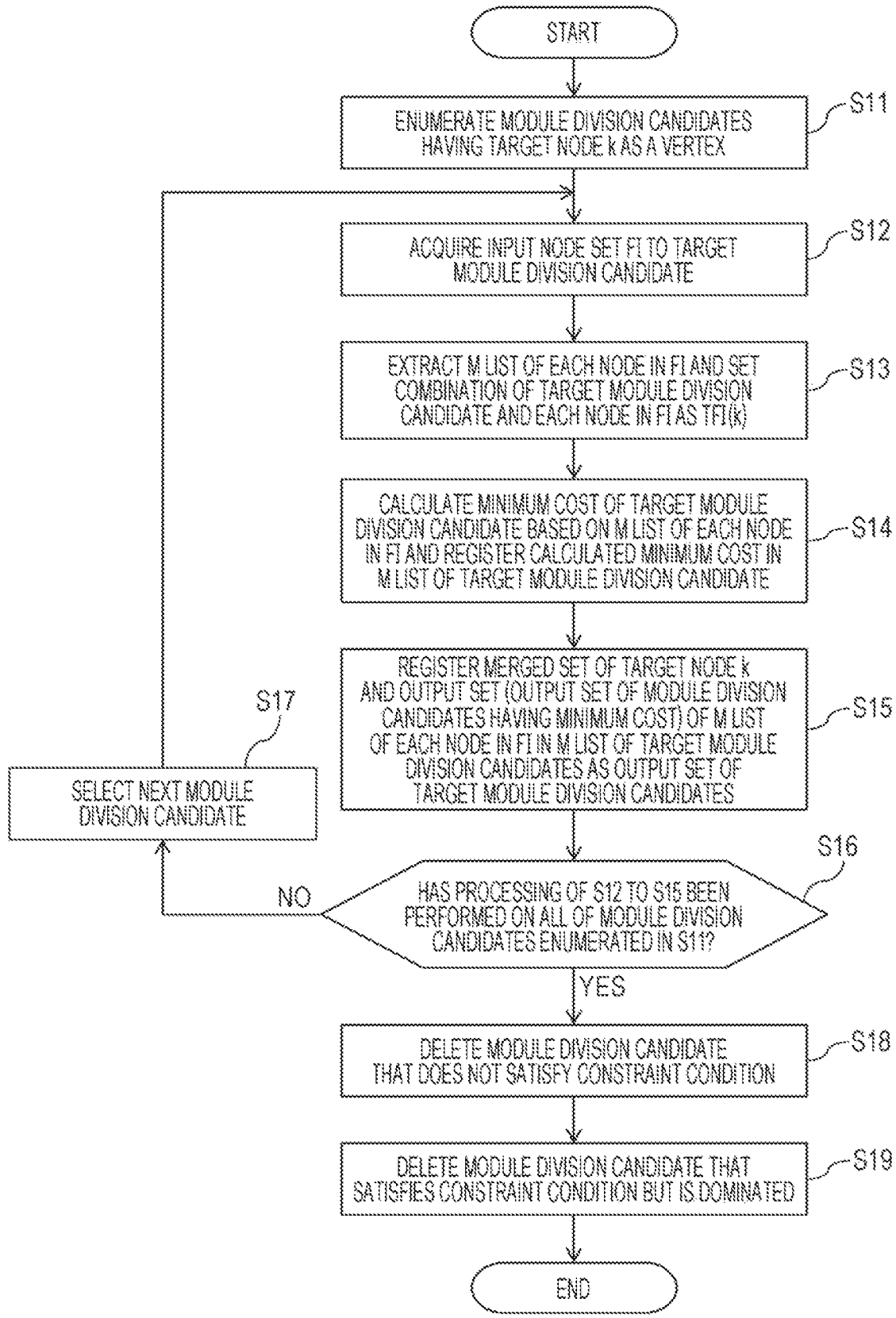
FIG. 12 is a flowchart illustrating an operation of a cost calculation unit in the information processing apparatus of the present embodiment.

Thereafter, the cost calculation unit 21 selects the next intermediate node in the topological order as the target node k and repeats the processing according to the flowchart illustrated in FIG. 12, and calculates and creates the M list 34 for all the intermediate nodes in the DFG 32.

Figures 10A, 10B, 10C:
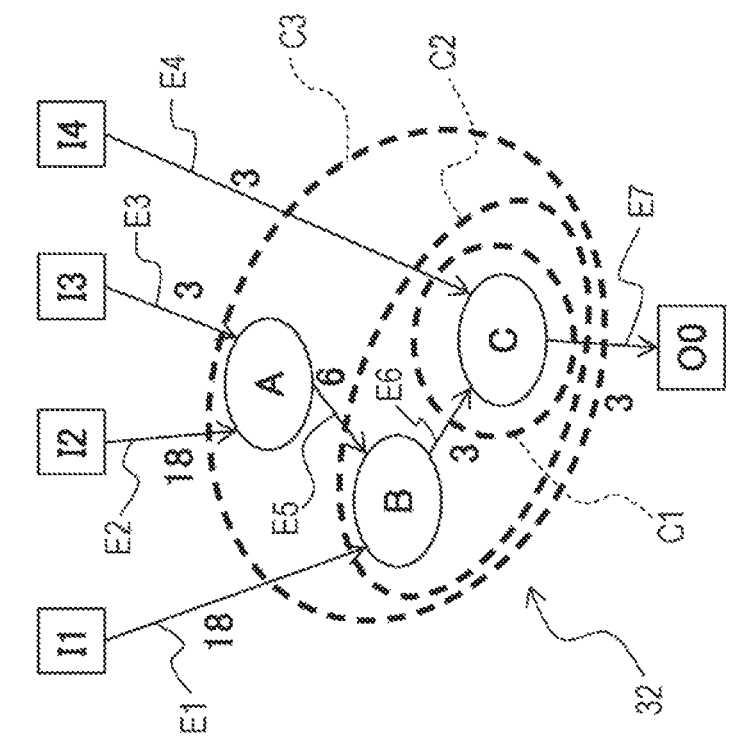
FIG. 10A is a diagram illustrating module partitioning candidates of a node C in the data flow graph illustrated in FIG. 9A.
FIG. 10B is a diagram illustrating an M list of each module partitioning candidate illustrated in FIG. 10A.
FIG. 10C is a diagram illustrating an M list of the node C in the data flow graph illustrated in FIG. 10A.

Next, with reference to FIGS. 10A to 10C, calculation and creation of the M list 34 of the node C in the DFG 32 illustrated in FIG. 10A will be described according to the flowchart illustrated in FIG. 12. FIG. 10A is a diagram illustrating module partitioning candidates C1 to C3 of the node C in the DFG 32 illustrated in FIG. 9A. FIG. 10B is a diagram illustrating the M list 34 of the respective module partitioning candidates C1 to C3 illustrated in FIG. 10A. FIG. 10C is a diagram illustrating the M list 34 of the node C in the DFG 32 illustrated in FIG. 10A. The DFG 32 illustrated in FIG. 10A is the same as the DFG 32 illustrated in FIGS. 8 and 9A, so the description thereof will be omitted.

Here, in a case where the intermediate node C is the target node, the procedure of calculating and creating the M list 34 of the node C and the M list 34 of the node C to be calculated and created will be described.

First, in the DFG 32 illustrated in FIG. 10A, module partitioning candidates having the intermediate node C as a vertex are enumerated (see step S11 in FIG. 12). At this time, three types of module partitioning candidates C1, C2, and C3 are enumerated. For example, the module partitioning candidates C1, C2, and C3 are {C}, {B, C}, and {A, B, C}, respectively.

In a case where the module partitioning candidate C1={C} is selected as the target module partitioning candidate, an input node set FI={B} which is an input to the selected target module partitioning candidate C1={C} is acquired (see step S12 in FIG. 12).

Then, the cost of the target module partitioning candidate C1={C} is calculated. At this time, the number of cuts on the output side of the target module partitioning candidate C1 is the total value "3" of the weight "3" assigned to the edge E7 traversing the partitioning boundary on the output side of the target module partitioning candidate. In addition, the number of cuts of the input side leaf node I4 of the target module partitioning candidate C1 is the sum value "3" of the weight "3" assigned to the edge E4 traversing the partitioning boundary between the target module partitioning candidate C1 and the input side leaf node I4. Further, the minimum cost out of the M list 34 of each intermediate node in the input node set FI is the cost "42" of the node set {A, B} as illustrated in FIG. 9B. Therefore, the minimum cost of the target module partitioning candidate C1 is 3+42+3=48, and as illustrated in FIG. 10B, "48" is registered in the M list 34 as the cost of the module partitioning candidate C1 (see step S14 in FIG. 12).

In addition, as illustrated in FIG. 10B, the merged set {B, C} of the target node C and the output set {B} of the module partitioning candidate having the minimum cost "42" out of the M list 34 of the intermediate node B in the input node set FI is registered in the M list 34 of the target module partitioning candidate C1 as an output set of the target module partitioning candidate C1 (see step S15 in FIG. 12). As a result, ({C}, 48, {B, C}) is registered in the M list 34 for the module partitioning candidate C1.

Next, in a case where the module partitioning candidate C2={B, C} is selected as the target module partitioning candidate, an input node set FI={A} which is an input to the selected target module partitioning candidate C2={B, C} is acquired (see step S12 in FIG. 12).

Then, the cost of the target module partitioning candidate C2={B, C} is calculated. Here, the number of cuts on the output side of the target module partitioning candidate C2 is the sum value "3" of the weight "3" assigned to the edge E7 traversing the partitioning boundary on the output side of the target module partitioning candidate. In addition, the number of cuts of the input side leaf nodes I1 and I4 of the target module partitioning candidate C2 is the sum value "21" of the weights "18" and "3" assigned to the edges E1 and E4 traversing the partitioning boundary between the target module partitioning candidate C1 and the input side leaf nodes I1 and I4. Further, the minimum cost out of the M list 34 of each intermediate node in the input node set FI is the cost "27" of the node set {A} as illustrated in FIG. 9B. Therefore, the minimum cost of the target module partitioning candidate C2 is 3+27+21=51, and as illustrated in FIG. 10B, "51" is registered in the M list 34 as the cost of the module partitioning candidate C2 (see step S14 in FIG. 12).

In addition, as illustrated in FIG. 10B, the merged set {A, C} of the target node C and the output set {A} of the module partitioning candidate having the minimum cost "51" out of the M list 34 of the intermediate node A in the input node set FI is registered in the M list 34 of the target module partitioning candidate C2 as an output set of the target module partitioning candidate C2 (see step S15 in FIG. 12). As a result, ({B, C}, 51, {A, C}) is registered in the M list 34 for the module partitioning candidate C2.

Next, in a case where the module partitioning candidate C3={A, B, C} is selected as the target module partitioning candidate, an input node set FI={φ (empty set)} which is an input to the selected target module partitioning candidate C3={A, B, C} is acquired (see step S12 in FIG. 12).

Then, the cost of the target module partitioning candidate C3={A, B, C} is calculated. Here, the number of cuts on the output side of the target module partitioning candidate C3 is the sum value "3" of the weights "3" assigned to the edges E7 traversing the partitioning boundary on the output side of the target module partitioning candidate. In addition, the number of cuts of the input side leaf nodes I1 to I4 of the target module partitioning candidate C3 is the sum value "42" of the weights "18", "18", "3", and "3" assigned to the edges E1 to E4 traversing the partitioning boundary between the target module partitioning candidate C1 and the input side leaf nodes I1 to I4. Further, the minimum cost out of the M list 34 of each intermediate node in the input node set FI is "0" because the input node set FI is an empty set. Therefore, the minimum cost of the target module partitioning candidate C3 is 3+42=45, and as illustrated in FIG. 10B, "45" is registered in the M list 34 as the cost of the module partitioning candidate C2 (see step S14 in FIG. 12).

In addition, since the input node set FI={φ (empty set)}, as illustrated in FIG. 10B, the target node C is registered in the M list 34 of the target module partitioning candidate C3 as an output set of the target module partitioning candidate C3 (see step S15 in FIG. 12). As a result, ({A, B, C}, 45, {C}) is registered in the M list 34 for the module partitioning candidate C3.

At this point, if the module partitioning candidates C1, C2, and C3 satisfy the constraint condition 33 and are not dominated by other module partitioning candidates, the module partitioning information obtained as illustrated in FIG. 10B is registered as it is as the M list 34 of the intermediate node C. For example, as illustrated in FIG. 10C, the M list of the intermediate node C={({C}, 48, {B, C}), ({B, C}, 51, {A, C}), ({A, B, C}, 45, {C})}.

[4-3] Operation of Selection Unit

Next, the operation of the selection unit 22 in the information processing apparatus 10 of the present embodiment will be described according to the flowchart (steps S21 to S25) illustrated in FIG. 13. After the M list 34 is created for each intermediate node in the DFG 32 in the processing illustrated in FIG. 12, the selection unit 22 performs the processing according to the flowchart illustrated in FIG. 13. For example, the selection unit 22 traces back from the output node of the DFG 32 while selecting the module partitioning candidate having the minimum cost as a partitioning target module, based on the cost of the M list 34.

First, at the output node (see the intermediate node C in FIG. 11, for example) of the DFG 32, the selection unit 22 adopts the module partitioning candidate having the minimum cost from the M list 34 of the output node (step S21).

The selection unit 22 traces an input node (each node in FI) to the adopted module partitioning candidate, for example, performs back-tracing of the input node (step S22).

Then, the selection unit 22 determines whether or not the flow has reached the leaf nodes on the input side of the DFG 32 (see leaf nodes I1 to I4 in FIG. 11, for example) as a result of back-tracing (step S23).

In a case where the flow does not reach the leaf nodes on the input side (NO route of step S23), the selection unit 22 adopts the module partitioning candidate used for calculating the cost of a previously adopted module partitioning candidate from the M list 34 of the input node (FI) of the previously adopted module partitioning candidate (step S24). Thereafter, the selection unit 22 returns to the processing of step S22.

The back-tracing processing (steps S22 to S24) by the selection unit 22 is repeatedly executed recursively until all the input nodes traced by the back-tracing become input side leaf nodes (until YES determination is made in step S23).

As a result of the back-tracing, in a case where the flow has reached the leaf nodes on the input side of the DFG 32, the selection unit 22 outputs and saves the set of module partitioning candidates adopted up to the time when the flow has reached the leaf node as a partitioning target module, for example, the module partitioning result 35 (step S25) and ends the processing.

Figure 11:
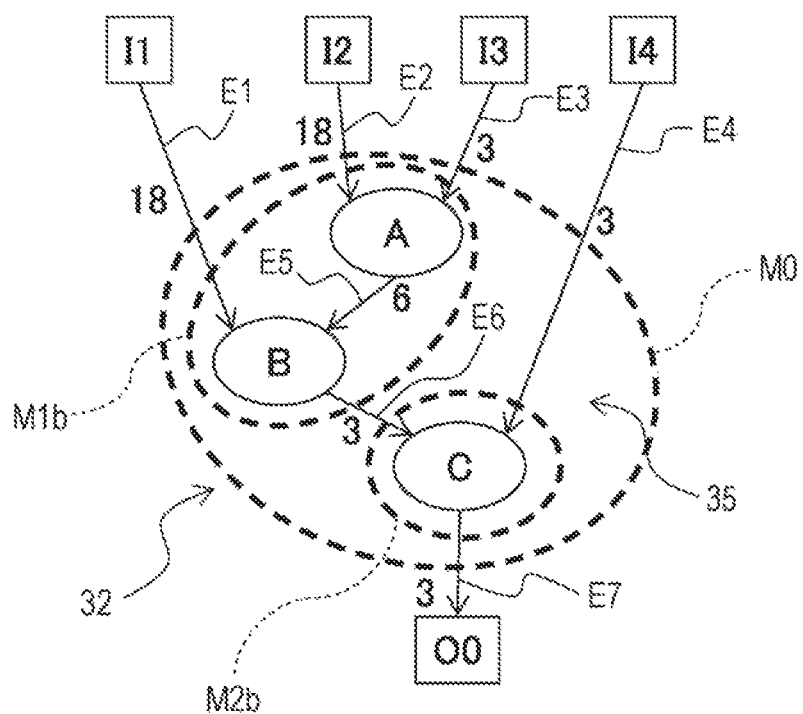
FIG. 11 is a diagram illustrating a module partitioning result of the data flow graph illustrated in FIG. 8, FIG. 9A, and FIG. 10A.

Next, with reference to FIG. 11, according to the flowchart illustrated in FIG. 13, the module partitioning result 35 for the DFG 32 illustrated in FIGS. 8, 9A and 10A, for example, the selection procedure of the module partitioning candidate having the minimum cost will be described. FIG. 11 is a diagram illustrating the module partitioning result 35 of the DFG 32 illustrated in FIGS. 8, 9A, and 10A. The DFG 32 illustrated in FIG. 11 is the same as the DFG 32 illustrated in FIGS. 8, 9A, and 10C, so the description thereof will be omitted.

Figure 13:
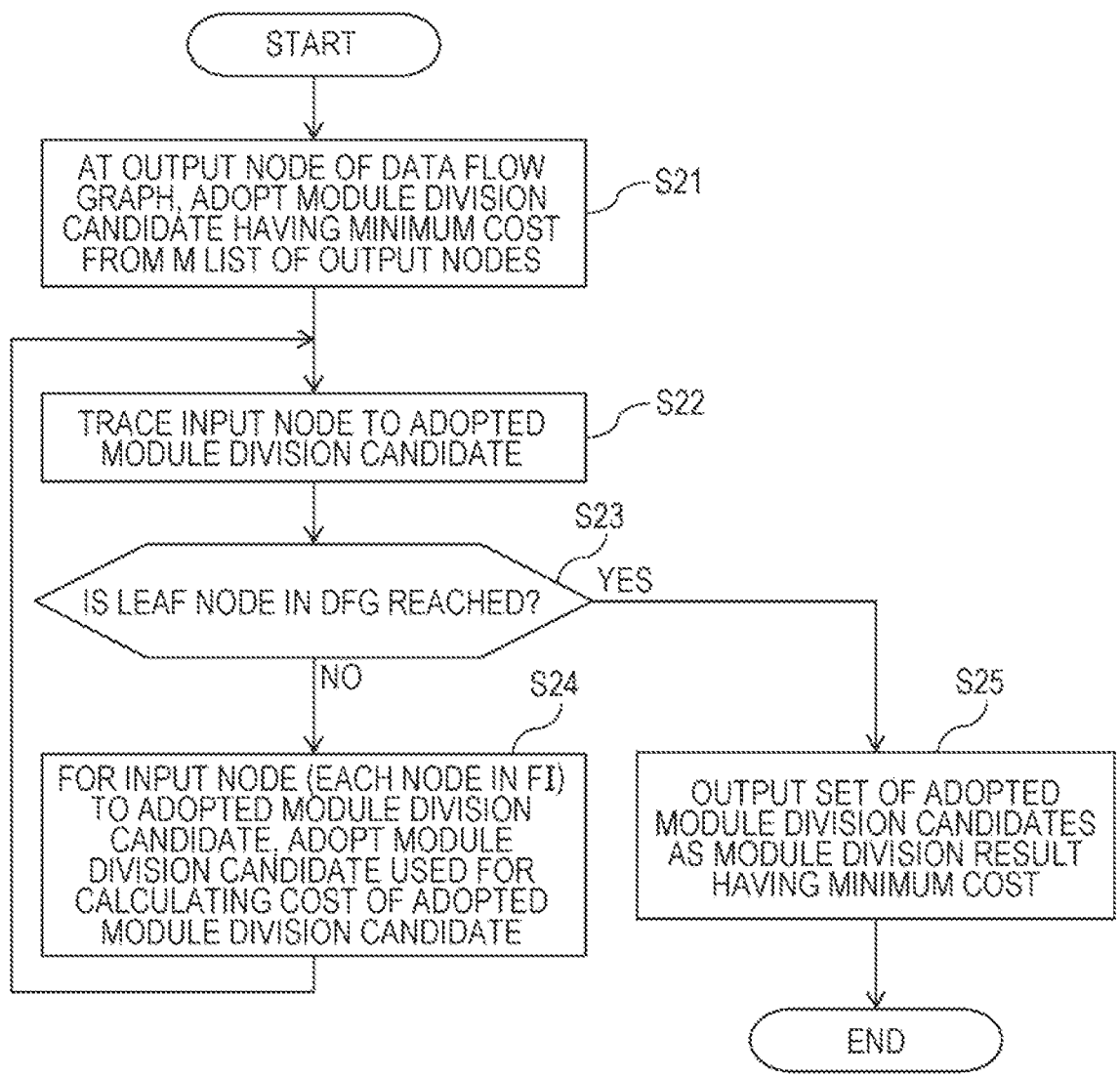
FIG. 13 is a flowchart illustrating an operation of a selection unit in the information processing apparatus of the present embodiment.

First, a module partitioning candidate having the minimum cost is adopted from the M list 34 of the output node C of the DFG 32 (see step S21 in FIG. 13). At this time, referring to the M list 34 of the intermediate node C illustrated in FIG. 10C, the minimum cost of the node C is "45", and the node set of the module partitioning candidate C3 having the minimum cost "45" is {A, B, C}.

Therefore, in particular, in a case where the constraint condition 33 is not set, the node set {A, B, C} corresponding to the module partitioning candidate C3 having the minimum cost "45" is output as one partitioning target module M0 as illustrated in FIG. 11 (see from YES route of steps S23 to S25 in FIG. 13).

On the other hand, in a case where "the capacity of one module is within 2 nodes" is set as the constraint condition 33, the module partitioning information of the node set {A, B, C} is deleted from the M list 34 of the intermediate node C illustrated in FIG. 10C. Therefore, the M list 34 of the intermediate node C illustrated in FIG. 10C is {({C}, 48, {B, C}), ({B, C}, 51, {A, C})}. Therefore, the minimum cost of the node C is "48", and the node set of the module partitioning candidate C1 having the minimum cost "48" is {C}.

Thereafter, when tracing the input node to the node C (see step S22 in FIG. 13), the flow reaches the intermediate node B (see the NO route of step S23 in FIG. 13). Therefore, for the input node B to the module partitioning candidate C1={C}, the module partitioning candidate [see ({A, B}, 42, {B}) in the M list 34 of the node B illustrated in FIG. 9B] used for calculating the cost "48" of the module partitioning candidate C1={C} is adopted (see step S24 in FIG. 13).

Then, when tracing the input node to the adopted module partitioning candidate {A, B} (see step S22 in FIG. 13), the flow reaches leaf nodes I1 to I3 on the input side (see the YES route of step S23 in FIG. 13).

Therefore, the set {M1b, M2b} of the module partitioning candidates adopted up to the time when the flow has reached the leaf node is output as a partitioning target module, for example, the module partitioning result 35 (see step S25 in FIG. 13). For example, as illustrated in FIG. 11, the DFG 32 is partitioned into two modules M1b and M2b as in the example of the partitioning result illustrated in FIG. 4B. Module M1b={A, B}, and module M2b={C}.

[5] More Specific Operation of Information Processing Apparatus of Present Embodiment Next, a specific operation (module partitioning operation) by the information processing apparatus 10 of the present embodiment will be described with reference to FIGS. 14A to 17.

Here, a specific example of the DFG 32 to be partitioned into modules illustrated in FIGS. 14A and 15A will be described. In FIGS. 14A and 15A, specific examples of the same DFG 32 are illustrated.

The DFG 32 illustrated in FIGS. 14A and 15A includes four leaf nodes I1 to I4 which are input nodes, and one leaf node O0 which is an output node. In addition, the DFG 32 includes six intermediate nodes A to F representing arithmetic processing.

Also in the DFG 32 illustrated in FIGS. 14A and 15A, thin arrows between the nodes are directed edges E11 to E20 representing data dependency between the nodes. Like the edges E1 to E7 described above, each of the edges E11 to E20 in the DFG 32 has a value corresponding to the wiring width of data flowing between the nodes, for example, the wiring width of the signal line as a weight. In the diagram, the numbers attached to edges E11 to E20 represent weights.

For example, in FIGS. 14A and 15A, a weight 4 is assigned to the directed edge E11 from the leaf node I1 to the intermediate node D, the directed edge E12 from the leaf node I2 to the intermediate node B, and the directed edge E13 from the leaf node I3 to the intermediate node A. A weight 2 is assigned to the directed edge E14 from the leaf node I4 to the intermediate node C. In addition, a weight 8 is assigned to the directed edge E15 from the intermediate node A to the intermediate nodes B and C, and a weight 4 is assigned to the directed edge E16 from the intermediate node B to the intermediate nodes D and E. Further, a weight 6 is assigned to the directed edge E17 from the intermediate node C to the intermediate node E, and a weight 4 is assigned to the directed edge E18 from the intermediate node D to the intermediate node F. Then, a weight 4 is assigned to the directed edge E19 from the intermediate node E to the intermediate node F, and a weight 4 is assigned to the directed edge E20 from the intermediate node F to the leaf node O0.

In the following, the module partitioning (creation of the M list 34 and selection of the minimum cost) of the DFG 32 illustrated in FIGS. 14A and 15A according to the present embodiment is considered. Here, it is assumed that the cost is the total number of cuts and "the number of intermediate nodes included in one module is 4 or less" as the constraint condition 33.

Here, the M list 34 of the nodes A to C in the DFG 32 illustrated in FIG. 14A will be described with reference to FIG. 14B, and the M list 34 of the nodes D to F in the DFG 32 illustrated in FIG. 15A will be described with reference to FIG. 15B.

Figure 14B:
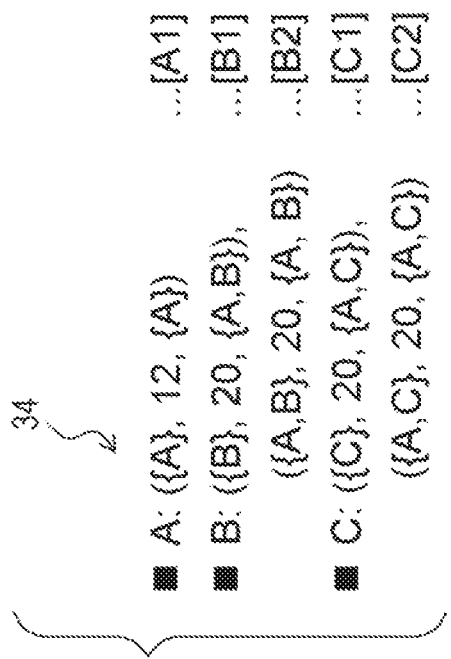
FIG. 14B is a diagram illustrating M lists of nodes A to C in the data flow graph illustrated in FIG. 14A.
Figure 14A:
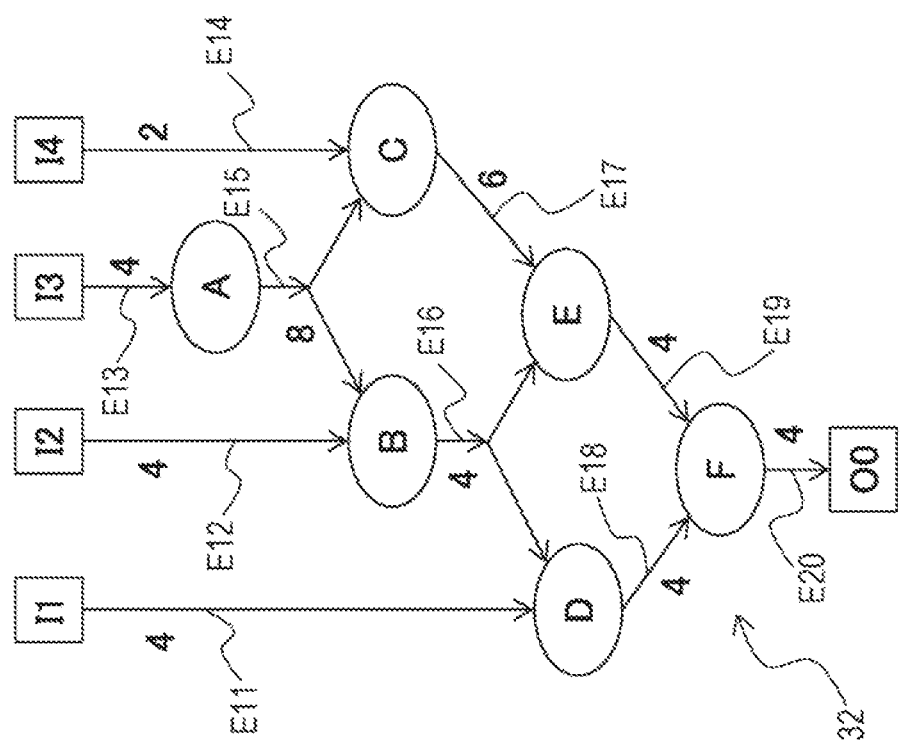
FIG. 14A is a diagram illustrating a specific example of a data flow graph to be partitioned into modules.
Figure 15A:
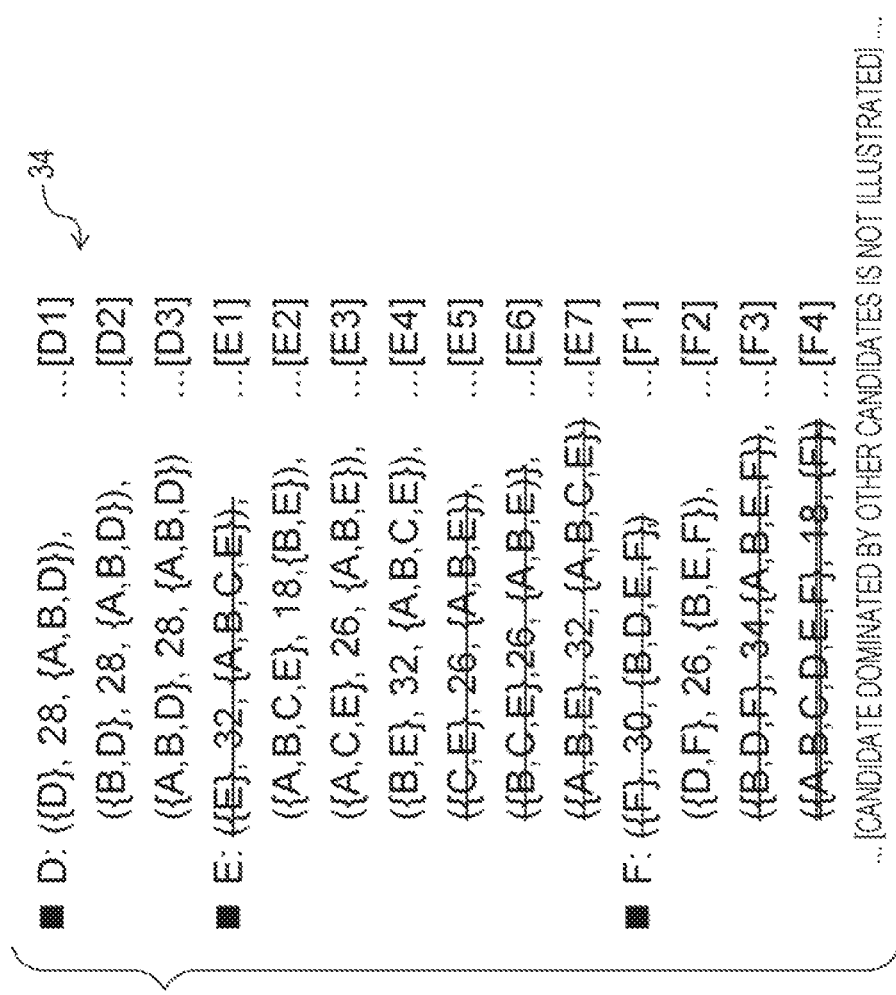
FIG. 15A is a diagram illustrating a specific example of a data flow graph to be partitioned into modules.
Figure 15B:
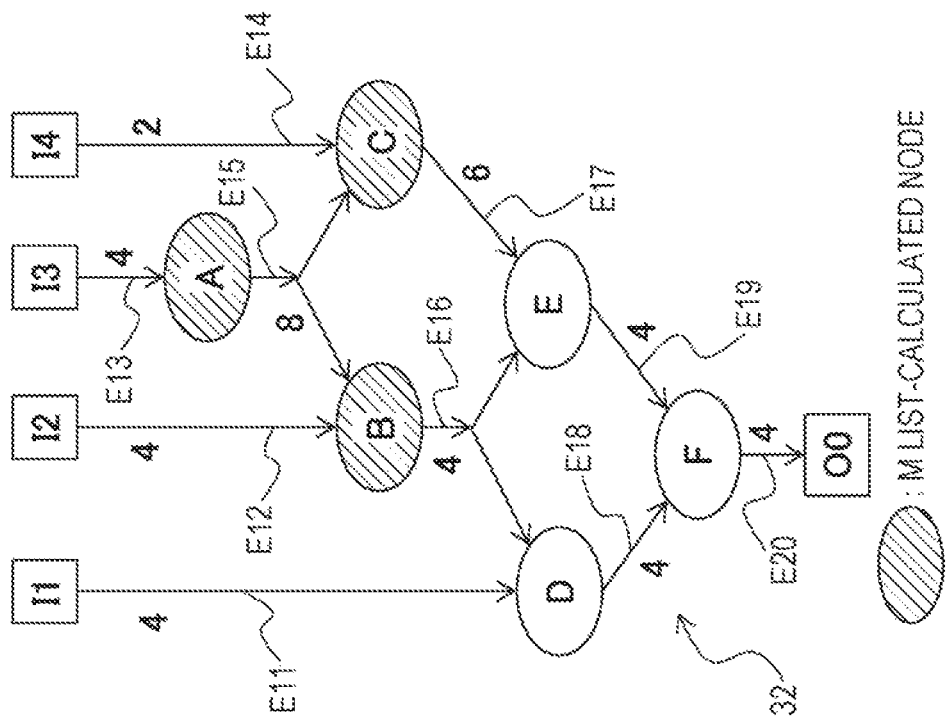
FIG. 15B is a diagram illustrating M lists of nodes E to F in the data flow graph illustrated in FIG. 15A.

FIG. 14B is a diagram illustrating the M list 34 of the nodes A to C in the DFG 32 illustrated in FIG. 14A, and FIG. 15B is a diagram illustrating the M list 34 of the nodes E to F in the DFG 32 illustrated in FIG. 15A. In addition, in FIGS. 14B and 15B, like the already described M list 34, the M list 34 of each intermediate node is created as a set of module partitioning information ({node set}, cost, {output set}) for each module partitioning candidate. Further, in FIGS. 14B and 15B, the appearance order of the intermediate nodes A to F corresponds to the above topological order.

With the function of the cost calculation unit 21 described above, the M list 34 of each of the intermediate nodes A to F in the DFG 32 illustrated in FIGS. 14A and 15A is calculated and created as illustrated in FIGS. 14B and 15B.

As illustrated in FIG. 14B, module partitioning candidates having the intermediate node A as a vertex is only one set of A1. In the candidate A1, the node set is {A}, the cost is "12", and the output set is {A}.

Module partitioning candidates having intermediate node B as a vertex are two sets of B1 and B2. In the candidate B1, the node set is {B}, the cost is "20", and the output set is {A, B}. In addition, in the candidate B2, the node set is {A, B}, the cost is "20", and the output set is {A, B}.

Similarly, module partitioning candidates having the intermediate node C as a vertex are two sets of C1 and C2. In the candidate C1, the node set is {C}, the cost is "20", and the output set is {A, C}. In addition, in the candidate C2, the node set is {A, C}, the cost is "20", and the output set is {A, C}.

As illustrated in FIG. 15B, module partitioning candidates having the intermediate node D as a vertex are three sets of D1 to D3. In the candidate D1, the node set is {D}, the cost is "28", and the output set is {A, B, D}. In addition, in the candidate D2, the node set is {B, D}, the cost is "28", and the output set is {A, B, D}. In the candidate D3, the node set is {A, B, D}, the cost is "28", and the output set is {A, B, D}.

Module partitioning candidates having the intermediate node E as a vertex is seven sets of E1 to E7. In the candidate E1, the node set is {E}, the cost is "32", and the output set is {A, B, C, E}. In the candidate E2, the node set is {A, B, C, E}, the cost is "18", and the output set is {B, E}. In the candidate E3, the node set is {A, C, E}, the cost is "26", and the output set is {A, B, E}. In the candidate E4, the node set is {B, E}, the cost is "32", and the output set is {A, B, C, E}. In the candidate E5, the node set is {C, E}, the cost is "26", and the output set is {A, B, E}. In the candidate E6, the node set is {B, C, E}, the cost is "26", and the output set is {A, B, E}. In the candidate E7, the node set is {A, B, E}, the cost is "32", and the output set is {A, B, C, E}.

Here, when calculating the cost, in a case where the TFI (k) of the node k belonging to the input node set FI overlaps, it is basic to calculate the cost by removing the cost of the overlapping portion.

For example, in the case of the candidate E1, for example, in a case where {E} is partitioned as one module, the cost of the candidate E1 is calculated as follows. The cost of {E} itself is the sum of the weight "4" of the output and the weight "0" of the input of the leaf node, which is "4". The cost of FI is the cost 20 of the node B (candidate B1) and cost 20 of the node C (candidate C1). Since the overlapping portion of FI is the node A, the cost of the overlapping portion is the cost 12 of the node A (candidate A1). Therefore, the cost of the candidate E1=4+20+20−12=32.

Similarly, for example, in the case of the candidate E3, for example, in a case where {A, C, E} is partitioned as one module, the cost of the candidate E3 is calculated as follows. The cost of {A, C, E} itself is the sum "18" of the weights "4" and "8" of the output and the weights "4" and "2" of the input of the leaf nodes I3 and I4. The cost of FI is the cost 20 of the node B (candidate B1). Since the overlapping portion of FI is the node A, the cost of the overlapping portion is the cost 12 of the node A (candidate A1). Therefore, the cost of the candidate E3=18+20−12=26.

In addition, for example, in the case of the candidate E4, for example, in a case where {B, E} is partitioned as one module, the cost of the candidate E4 is calculated as follows. The cost of {B, E} itself is the sum of the weight "4" of the output, "4", and the weight "4" of the input of the leaf node I2, which is "12". The cost of FI is the cost 20 of the node C (candidate C1). At this time, since the input A of FI is covered by the output set {A, C} of the candidate C1, it is optional to account for the cost. Therefore, the cost of candidate E4=12+20=32.

Module partitioning candidates having the intermediate node F as a vertex are F1 to F4. In the candidate F1, the node set is {F}, the cost is "30", and the output set is {B, D, E, F}. In the candidate F2, the node set is {D, F}, the cost is "26", and the output set is {B, E, F}. In the candidate F3, the node set is {B, D, F}, the cost is "34", and the output set is {A, B, E, F}. In the candidate E4, the node set is {A, B, C, D, E, F}, the cost is "18", and the output set is {F}.

In FIG. 15B, candidates (for example, candidates E1, E5, E6, E7, F1, F3, . . . ) canceled by a single strike-through line indicate candidates deleted from the M list 34 because the candidates are dominated by other candidates.

In addition, in FIG. 15B, candidates (for example, candidate F4) canceled by a double strike-through line indicate candidates deleted from the M list 34 because the number of intermediate nodes belonging to the node set of the candidate does not satisfy "the number of intermediate nodes included in one module is 4 or less" which is the constraint condition 33.

Figure 16:
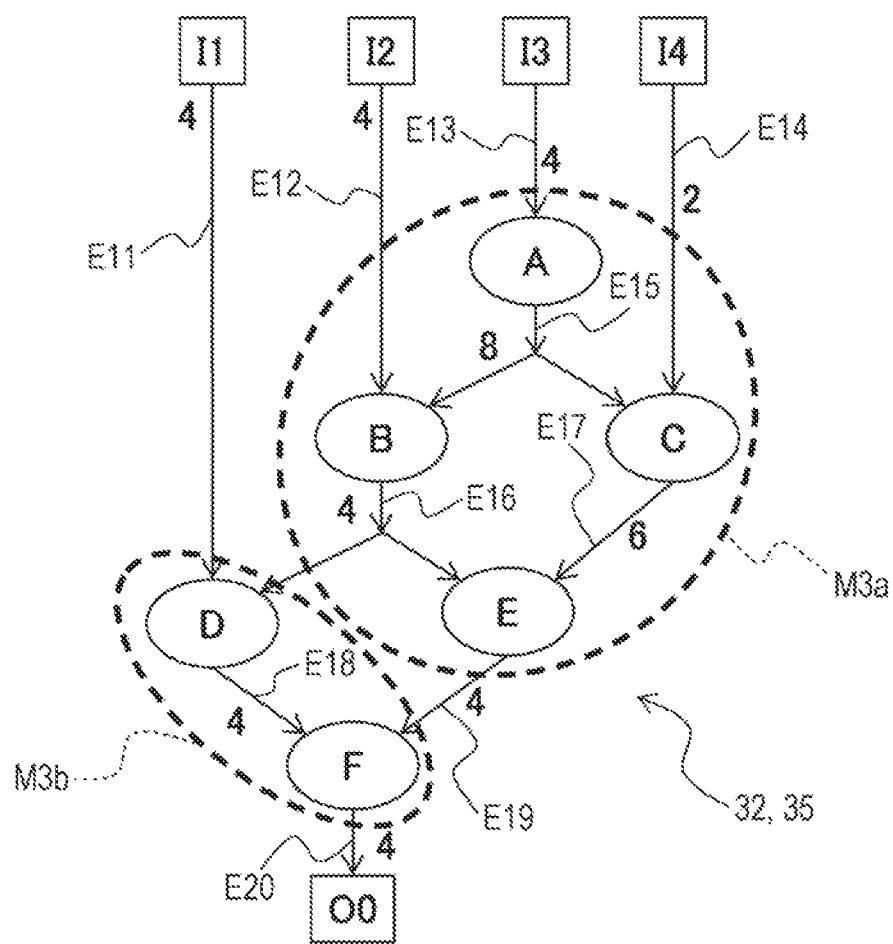
FIG. 16 is a diagram illustrating a module partitioning result according to the present embodiment of the data flow graph illustrated in FIGS. 14A and 15A.

Then, in the present embodiment, based on the M list 34 of each of the nodes A to F created as illustrated in FIGS. 14B and 15B, with the function of the selection unit 22, as illustrated in FIG. 16, the module partitioning candidates F2 and E2 are selected as a partitioning target module (module partitioning result 35). FIG. 16 is a diagram illustrating the module partitioning result 35 according to the present embodiment of the DFG 32 illustrated in FIGS. 14A and 15A.

At this time, the selection unit 22 first adopts the module partitioning candidate F2 having the minimum cost "26" from the M list 34 (see FIG. 15B) of the output node F of the DFG 32. The module partitioning candidate F2 having the minimum cost "26" corresponds to a module M3b in FIG. 16.

Thereafter, when tracing the input node to the candidate F2, the selection unit 22 adopts the module partitioning candidate E2 having the minimum cost "18" from the M list 34 (see FIG. 15B) of the output node F of the DFG 32. The module partitioning candidate E2 having the minimum cost "18" corresponds to a module M3a in FIG. 16.

In this manner, according to the present embodiment, the DFG 32 as illustrated in FIGS. 14B and 15B is partitioned into two modules M3a and M3b as illustrated in FIG. 16. In this module partitioning, the total number of cuts is "26", which coincides with the above-described minimum cost "26".

Figure 17:
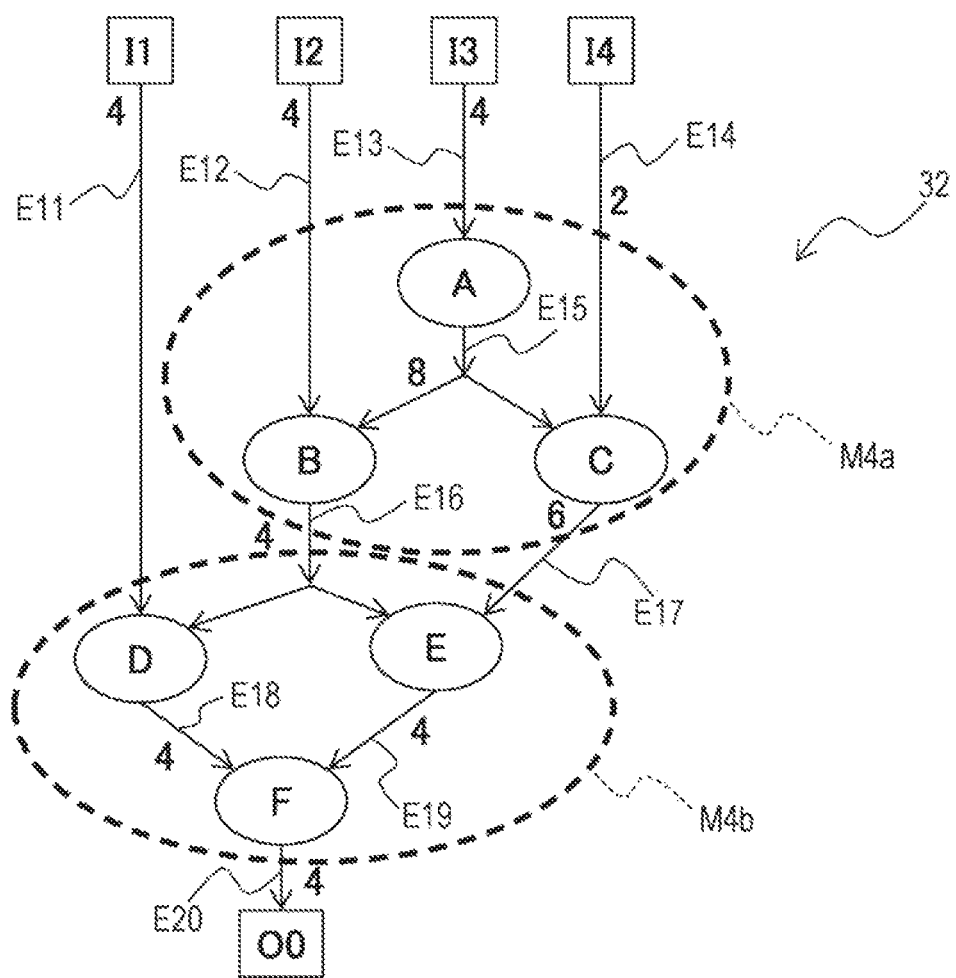
FIG. 17 is a diagram illustrating a module partitioning result by a method of the data flow graph illustrated in FIGS. 14A and 15A in the related art.

Here, in a case where the above-described technique (for example, Japanese Laid-open Patent Publication No. 2010-113405) is applied to the DFG 32 as illustrated in FIGS. 14B and 15B, as illustrated in FIG. 17, module partitioning is performed to partition the maximum path length between the input side leaf nodes I1 to I4 and the output side leaf node O0 into two. FIG. 17 is a diagram illustrating the result of module partitioning by the method of the DFG 32 illustrated in FIGS. 14A and 15A in the related art.

In the DFG 32 illustrated in FIGS. 14A, 15A, 16, and 17, since the maximum path length (the maximum number of node stages) is "4", the part partitioning the maximum path length into two is uniquely determined and is between the nodes B and D and between the nodes C and E. Therefore, as illustrated in FIG. 17, the DFG 32 is partitioned into two modules M4a={A, B, C} and M4b={D, E, F}. It is obvious that the total number of cuts of such module partitioning is "28" which is worse than the total number of cuts (cost) "26" of module partitioning according to the present embodiment described above.

[6] Effect of Present Embodiment

In this manner, according to the present embodiment, a plurality of module partitioning candidates are created from the DFG 32, a total number of cuts (cost) is obtained for each module partitioning candidate, and a module partitioning candidate having the minimum total number of cuts is selected. As a result, it is possible to perform optimum module partitioning without depending on the skill of the user.

In addition, it is possible to reduce the calculation amount for calculating the cost by calculating the cost in the topological order. For example, it is guaranteed that module partitioning by optimum cost may be efficiently obtained by performing calculation processing based on a topological order.

Further, it is possible to provide a design environment in which a trade-off may be made between the number of steps involved in layout synthesis and the performance of a circuit obtained as a design result by applying the module partitioning method of the present embodiment in consideration of the wiring property to the circuit design using a high-level synthesis tool. In particular, the technique of the present embodiment is effectively applied in circuit design for hardware devices such as LSI and FPGA.

In addition, the module partitioning method of the present embodiment may be applied to a large-scale DFG 32 by efficient calculation of the M list 34 including the cost (total number of cuts). For example, assuming that the number of nodes of the DFG 32 is N and the capacity of one module is the number m of nodes, the calculation of the M list 34 of one node is at most O (m) (O: order). Since the M list 34 is calculated for all the nodes, the total calculation amount is O (m*N), which is proportional to the size of the DFG 32.

[7] Other

The preferred embodiment of the present invention has been described in detail above, but the present invention is not limited to such a specific embodiment, and various modifications and changes may be made without departing from the spirit of the present invention.

For example, in the above-described embodiment, the case where the cost is the total number of cuts has been described, but the present invention is not limited thereto. In addition to the total number of cuts, for example, the speed performance of the circuit (maximum delay, throughput, and the like) may be used as the cost. Here, the maximum number of the module stages on the DFG may be regarded as the maximum delay of the circuit.

In addition, in the embodiment described above, the case where the output unit that outputs the information such as the module partitioning result 35 is the display unit 50 such as the monitor 14*a* that displays and outputs the information has been described. The present invention is not limited thereto, and the output unit may be a printing apparatus such as a printer that prints out the information and it is possible to obtain the same operation and effect as the above-described embodiment.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing apparatus comprising:
    a memory; and
    a processor coupled to the memory and the processor configured to:
       create module partitioning candidates of a plurality of software codes, each module partitioning candidate including at least one input node from a plurality of input nodes in a data flow graph,
       calculate a cost, for each of the module partitioning candidates, equal to a total of weights assigned to edges that traverse a boundary of each module partitioning candidate, each of the weights being a number of variables that flow between nodes through each edge, and
       select at least one module partitioning candidate having a given cost from the module partitioning candidates as a partitioning target module based on the calculated cost.

2. The information processing apparatus according to claim 1, wherein the given cost is a minimum cost.

3. The information processing apparatus according to claim 1, wherein
    a constraint condition for each module partitioning candidate is preset, and
    the processor is further configured to create a module partitioning candidate that satisfies the constraint condition as the partitioning target module.

4. The information processing apparatus according to claim 3, wherein the constraint condition is at least one of a number of the nodes included in each module partitioning candidate, an area of each module partitioning candidate, and a throughput of each module partitioning candidate.

5. The information processing apparatus according to claim 1, wherein the processor is further configured to calculate the calculated cost in a topological order from a node on an input side in the data flow graph.

6. A non-transitory computer-readable recording medium storing therein a program for causing a computer to execute a process, the process comprising:
    creating module partitioning candidates of a plurality of software codes, each module partitioning candidate including at least one node from a plurality of input nodes in a data flow graph;
    calculating a cost, for each of the module partitioning candidates, equal to a total of weights assigned to edges that traverse a boundary of each module partitioning candidate, each of the weights being a number of variables that flow between nodes through each edge; and
    selecting at least one module partitioning candidate having a given cost from the plurality of module partitioning candidates as a partitioning target module based on the cost calculated by the calculating for each of the module partitioning candidates.

7. The non-transitory computer-readable recording medium according to claim 6, wherein the given cost is a minimum cost.

8. The non-transitory computer-readable recording medium according to claim 6, the process further comprising:
    presetting a constraint condition for each module partitioning candidate; and
    creating or selecting a module partitioning candidate that satisfies the constraint condition as the partitioning target module.

9. The non-transitory computer-readable recording medium according to claim 8, wherein the constraint condition is at least one of a number of the nodes included in each module partitioning candidate, an area of each module partitioning candidate, and a throughput of each module partitioning candidate.

10. The non-transitory computer-readable recording medium according to claim 6, the calculating comprising calculating the cost in a topological order from a node on an input side in the data flow graph.

11. An information processing method, the method comprising:
    creating, by a computer, module partitioning candidates, each including at least one node from nodes which are a plurality of operation units in a data flow graph;
    calculating a cost, for each of the module partitioning candidates, equal to a total of weights assigned to edges that traverse a boundary of each module partitioning candidate, each of the weights being a number of variables that flow between nodes through each edge; and
    selecting at least one module partitioning candidate having a given cost from the plurality of module partitioning candidates as a partitioning target module based on the calculated cost.

12. The information processing method according to claim 11, wherein the given cost is a minimum cost.

13. The information processing method according to claim 11, further comprising:
    presetting a constraint condition for each module partitioning candidate; and creating or selecting a module partitioning candidate that satisfies the constraint condition as the partitioning target module.

14. The information processing method according to claim 13, wherein the constraint condition is at least one of a number of the nodes included in each module partitioning candidate, an area of each module partitioning candidate, and a throughput of each module partitioning candidate.

15. The information processing method according to claim 11, further comprising calculating the cost in a topological order from a node on an input side in the data flow graph.

* * * * *